United States Patent
Lin et al.

(10) Patent No.: US 12,313,796 B2
(45) Date of Patent: May 27, 2025

(54) OXYGEN- AND FLUORINE-DOPED CESIUM AND RUBIDIUM LEAD PEROVSKITE COMPOUNDS FOR HARD RADIATION DETECTION

(71) Applicants: Northwestern University, Evanston, IL (US); UChicago Argonne, LLC, Chicago, IL (US)

(72) Inventors: Wenwen Lin, Willowbrook, IL (US); Duck Young Chung, Bolingbrook, IL (US); Mercouri G. Kanatzidis, Wilmette, IL (US)

(73) Assignees: Northwestern University, Evanston, IL (US); UChicago Argonne, LLC, Chicago, IL (US)

( * ) Notice: Subject to any disclaimer, the term of this patent is extended or adjusted under 35 U.S.C. 154(b) by 294 days.

(21) Appl. No.: 17/919,825

(22) PCT Filed: May 5, 2021

(86) PCT No.: PCT/US2021/030816
§ 371 (c)(1),
(2) Date: Oct. 19, 2022

(87) PCT Pub. No.: WO2021/226191
PCT Pub. Date: Nov. 11, 2021

(65) Prior Publication Data
US 2023/0203372 A1  Jun. 29, 2023

Related U.S. Application Data

(60) Provisional application No. 63/020,176, filed on May 5, 2020.

(51) Int. Cl.
*G01T 1/24* (2006.01)
*C01G 21/00* (2006.01)
(Continued)

(52) U.S. Cl.
CPC ............ *G01T 1/241* (2013.01); *C01G 21/006* (2013.01); *C09K 11/665* (2013.01); *C30B 11/02* (2013.01);
(Continued)

(58) Field of Classification Search
CPC ........... G01T 1/24; G01T 1/241; G01T 1/242; G01T 1/249
(Continued)

(56) References Cited

U.S. PATENT DOCUMENTS 7,141,794 B2 * 11/2006 Srivastava ........... C09K 11/772
250/361 R
8,519,347 B2   8/2013 Kanatzidis et al.
(Continued)

FOREIGN PATENT DOCUMENTS

CN   107123741 A    9/2017
CN   110330435 A   10/2019
(Continued)

OTHER PUBLICATIONS

Chen-Fu Lin et al., Perovskite-Based X-ray Detectors, Nanomaterials (Basel). Jul. 7, 2023;13(13):2024. (Year: 2023).*
(Continued)

*Primary Examiner* — Allen C. Ho
(74) *Attorney, Agent, or Firm* — Bell & Manning LLC

(57) ABSTRACT

Inorganic perovskites doped with oxygen atoms or fluorine atoms, methods for making the doped perovskites, and hard radiation detectors incorporating the doped perovskites as photoactive layers are provided. The doped perovskites utilize lead oxide, lead fluoride, or compounds that thermally decompose into lead oxide or lead fluoride as dopant atom sources. During the crystallization of a perovskite in
(Continued)

the presence of the dopant atom sources, oxygen or fluoride atoms from the dopant source are incorporated into the perovskite crystal lattice.

20 Claims, 28 Drawing Sheets

(51) Int. Cl.
  *C09K 11/66* (2006.01)
  *C30B 11/02* (2006.01)
  *C30B 29/12* (2006.01)
  *G01T 1/202* (2006.01)

(52) U.S. Cl.
  CPC ............ *C30B 29/12* (2013.01); *G01T 1/2023* (2013.01); *C01P 2002/34* (2013.01); *C01P 2002/54* (2013.01); *C01P 2002/72* (2013.01); *C01P 2006/40* (2013.01)

(58) Field of Classification Search
  USPC .............................. 250/370.09; 378/19, 98.8
  See application file for complete search history.

(56) References Cited

U.S. PATENT DOCUMENTS

| | | | |
|---|---|---|---|
| 9,181,475 | B2 | 11/2015 | Kanatzidis et al. |
| 9,983,319 | B2* | 5/2018 | Fischer ................ G01T 1/2023 |
| 10,504,659 | B2* | 12/2019 | Saidaminov ......... H10K 30/451 |
| 10,775,505 | B2* | 9/2020 | Valouch ................ A63F 13/213 |
| 10,892,416 | B2* | 1/2021 | Huang ...................... G01T 1/24 |
| 11,195,967 | B2* | 12/2021 | Kanatzidis ................ G01T 1/24 |
| 11,309,138 | B2* | 4/2022 | Tan ...................... H01G 9/2095 |
| 11,897,784 | B2* | 2/2024 | Yang ......................... G01T 1/16 |
| 2005/0285041 | A1 | 12/2005 | Srivastava et al. |
| 2013/0320836 | A1 | 12/2013 | Kanatzidis et al. |
| 2018/0218845 | A1 | 8/2018 | Tan et al. |
| 2019/0074140 | A1 | 3/2019 | Saidaminov et al. |
| 2023/0378388 | A1 | 11/2023 | Kanatzidis et al. |

FOREIGN PATENT DOCUMENTS

| | | |
|---|---|---|
| CN | 110628428 A | 12/2019 |
| CN | 210129523 U | 3/2020 |
| WO | WO 2019/051056 A1 | 3/2019 |
| WO | WO 2019/195873 A1 | 10/2019 |

OTHER PUBLICATIONS

The International Search Report and the Written Opinion issued on Oct. 13, 2021 for international patent application No. PCT/US21/30816; pp. 1-13.

Shun-Chang Liu et al., "Investigation of Oxygen Passivation for High-Performance All-Inorganic Perovskite Solar Cells," *J. Am. Chem. Soc.* 2019, vol. 141. 45; pp. 18075-18082.

Indika U. Arachchige et al., "Mercouri G. Kanatzidis: Excellence and Innovations in Inorganic and Solid-State Chemistry," *Inorg. Chem.* 2017, vol. 56; pp. 7582-7597 DOI: 10.1021/acs.inorgchem.7b00933.

Haotong Wei et al., "Halide lead perovskites for ionizing radiation detection," *Nature Communications* (2019), 10: 1066; pp. 1-12. https//doi.org/10.1038/s41467-019-08981-w.

Jinlu He et al., "Superoxide/Peroxide Chemistry Extends Charge Carriers' Lifetime but Undermines Chemical Stability of CH3NH3PbI3 Exposed to Oxygen: Time-Domain ab Initio Analysis," *J. Am. Chem. Soc.* 2019, 141; pp. 5798-5807.

Like Huang et al. "Oxygen-induced defect-healing and photo-brightening of halide perovskite semiconductors: science and application." Journal of Materials Chemistry A 9.8 (2021): 4379-4414.

Shun-Chang Liu et al., Supporting Information for: "Investigation of Oxygen Passivation for High-Performance All-Inorganic Perovskite Solar Cells," *J. Am. Chem. Soc.* 2019, vol. 141. 45; pp. S1-S16.

English Translation of Japanese Office Action mailed Jan. 28, 2025 for JP Application No. 2022-567127; pp. 1-3.

* cited by examiner

OXYGEN- AND FLUORINE-DOPED CESIUM AND RUBIDIUM LEAD PEROVSKITE COMPOUNDS FOR HARD RADIATION DETECTION

CROSS-REFERENCE TO RELATED APPLICATIONS

The present application is a National Stage of International Application No. PCT/US21/30816, filed May 5, 2021, which claims priority to U.S. provisional patent application No. 63/020,176, filed May 5, 2020, the entire contents of both of which are incorporated herein by reference.

REFERENCE TO GOVERNMENT RIGHTS

This invention was made with government support under 2014-DN-077-ARI086-01 awarded by the Department of Homeland Security and under DE-AC02-06CH11357 awarded by the Department of Energy. The government has certain rights in the invention.

BACKGROUND

Preventing radiative nuclear material from being used for malicious purposes is a primary global security concern. In order to solve this challenging issue, highly sensitive, chemically stable and low-cost room temperature radiation detector semiconductors (RTSD) are in great demand. The ideal RTSD should have capability to efficiently identify low-flux radiation sources even if the radiation is weak or shielded. Several diverse and stringent criteria should be simultaneously met for RTSD candidates to identify radiation sources with high energy resolution. Some of the most desirable criteria are as follows: (i) sufficiently wide bandgap ($E_g$>1.5 eV) to inhabit thermal ionization of carriers at room temperature; (ii) high average atomic number (Z) and density to ensure high absorption efficiency for high-energy radiation; (iii) high lattice tolerance for deep level trapping of photoinduced carriers; (iv) absence of polarization effects for long-term performance; (v) high radiation hardness and high chemical stability; and (vi) high carrier mobility-lifetime product $\mu\tau$ to enable the identification and characterization of various low-flux radiation sources. Due to the above strict requirements, only a limited number of semiconductor compounds have been identified as promising for ionizing radiation detector materials. To date, the leading semiconductor detector materials with spectroscopic performance include high-purity germanium (HPGe), CdTe based compounds, TlBr, $BiI_3$, $HgI_2$, and $PbI_2$. Though HPGe provides the best energy resolution below 0.8% for γ-rays, the detector needs to be cooled down by liquid nitrogen when functioning due to its intrinsically narrow bandgap, limiting its extensive application. Even the most commercialized RTSDs, CdTe based compounds, still suffer from the intrinsic drawbacks associated with Te precipitates, macro-scale defects, and compositional nonuniformity. TlBr is a developing RTSD which has exhibited spectroscopic performance for γ-rays with high electron mobility-lifetime ($\mu\tau$) products and electron lifetime. However, TlBr suffers from intrinsic polarization-induced instability and poor mechanical hardness that is detrimental to material processing. Other highly dense binary semiconductor detection materials such as $HgI_2$, $PbI_2$, and $BiI_3$ are highly resistive but are plagued by hygroscope and mechanical deformation due to the nature of their two-dimensional crystal structures.

Recently, the all-inorganic semiconductor $CsPbBr_3$, with perovskite structure, strong photon stopping power, and high chemical stability, has been identified as a promising semiconductor radiation detector material with a high energy resolution of ~3.8% and a long hole mobility-lifetime product of $10^{-3}$ $cm^2$/V upon 122 keV Gamma-rays. (He, Y. H. et al., Nat Commun 2018, 9, 1609.) This compound comprises Cs and Pb atoms whose atomic numbers are both high, and the compact crystal structure gives it a high density. The high average atomic number and density both ensure a high photon stopping power under radiation. However, the yield ratio and detection performance upon hard radiation vary from batch to batch, resulting in uncontrollability of detection performance and yield ratio.

SUMMARY

Oxygen-doped perovskites and fluorine-doped perovskites for use in the detection of hard radiation, radiation detectors incorporating the doped perovskites, methods of using the radiation detectors, and methods of making the doped perovskites are provided.

Examples of doped perovskites include: a perovskite single-crystal having the chemical formula $CsAX_3$, the chemical formula $RbAX_3$, or the chemical formula $Cs_{1-x}Rb_xPbX_3$ where 0<x<1, wherein A represents Pb or a combination of Pb and one or more of Sn, Si, and Ge, and X represents one or more halogen atoms; and oxygen atom dopants or fluorine atom dopants in the crystal lattice of the perovskite single-crystal.

Examples of devices for the detection of incident radiation include: a photoactive layer comprising: a perovskite single-crystal having the chemical formula $CsAX_3$, the chemical formula $RbAX_3$, or the chemical formula $Cs_{1-x}Rb_xPbX_3$ where 0<x<1, wherein A represents Pb or a combination of Pb and one or more of Sn, Si, and Ge, and X represents one or more halogen atoms; and oxygen atom dopants or fluorine atom dopants in the crystal lattice of the perovskite single-crystal. The devices further include: a first electrode in electrical communication with the photoactive layer; a second electrode in electrical communication with the photoactive layer, wherein the first and second electrodes are configured to apply an electric field across the photoactive layer; and a signal detector configured to measure a photocurrent generated in the photoactive layer when the photoactive layer is exposed to incident X-rays, gamma-rays, and/or alpha-particles.

Examples of methods for detecting incident radiation using the device described herein include the steps of: exposing the photoactive layer of the device to incident radiation comprising X-rays, gamma rays, and/or alpha particles, whereby the oxygen-doped perovskite or the fluorine-doped perovskite absorbs the incident radiation and a photocurrent is generated in the material; and measuring at least one of the energy and the intensity of the absorbed incident radiation by detecting the photocurrent.

Examples of methods of making an oxygen-doped or fluorine-doped perovskite having the chemical formula $CsAX_3$, where A represents Pb or a combination of Pb and one or more of Sn, Si, and Ge, X represents one or more halogen atoms, include the steps of: forming a mixture of a perovskite having the chemical formula $CsAX_3$, the chemical formula $RbAX_3$, or the chemical formula $Cs_{1-x}Rb_xPbX_3$ where 0<x<1, where A represents Pb, Sn, Si, Ge, or a combination of two or more thereof, and X represents one or more halogen atoms, and a dopant source compound comprising: PbO; a lead and oxygen-containing compound that decomposes into PbO when it is heated; $PbF_2$; or a lead and oxygen-containing compound that decomposes into $PbF_2$ when it is heated; melting the perovskite and dopant source to form a melt; and crystalizing the oxygen-doped perovskite or the fluorine-doped perovskite from the melt.

BRIEF DESCRIPTION OF THE DRAWINGS

Illustrative embodiments of the invention will hereafter be described with reference to the accompanying drawings, wherein like numerals denote like elements.

(FIG. 4B) the middle section; and (FIG. 4C) the tail section of a boule that was made using PbO as a dopant source compound at a concentration of 0.10%. The boule has a length of around 4.0 cm.

(FIG. 5B) Pb 3d electrons; (FIG. 5C) O1s electron from undoped $CsPbBr_3$, $CsPbBr_3$ made using 0.05% PbO as a dopant source compound, and PbO; (FIG. 5D) Cs 4d electrons from undoped $CsPbBr_3$ and $CsPbBr_3$ made using 0.05% PbO as a dopant source compound. Spectra were fit using standard Gaussian profiles.

(FIG. 6B) O1s electron from the surface of darkened $PbBr_2$ powder which has photodegraded. In order to obtain signals from the surface layer, no surface etching was done prior to XPS measurements. Spectra were fit using standard Gaussian profiles.

(FIG. 7B) $CsPbBr_3$ crystals made using various PbO concentrations using a laser power of 0.5 mW; (FIG. 7C) general peak location and intensity as a function of PbO concentration; (FIG. 7D) room temperature time-resolved decay spectrum of emission at 524 nm for an undoped $CsPbBr_3$ crystal; (FIG. 7E) room temperature time-resolved decay spectra of emission at 534 nm for $CsPbBr_3$ crystals made using various PbO concentrations; (FIG. 7F) average photoluminescence (PL) decay time as a function of concentration.

(FIG. 8C) 1 mW.

DETAILED DESCRIPTION

Figure 1A:
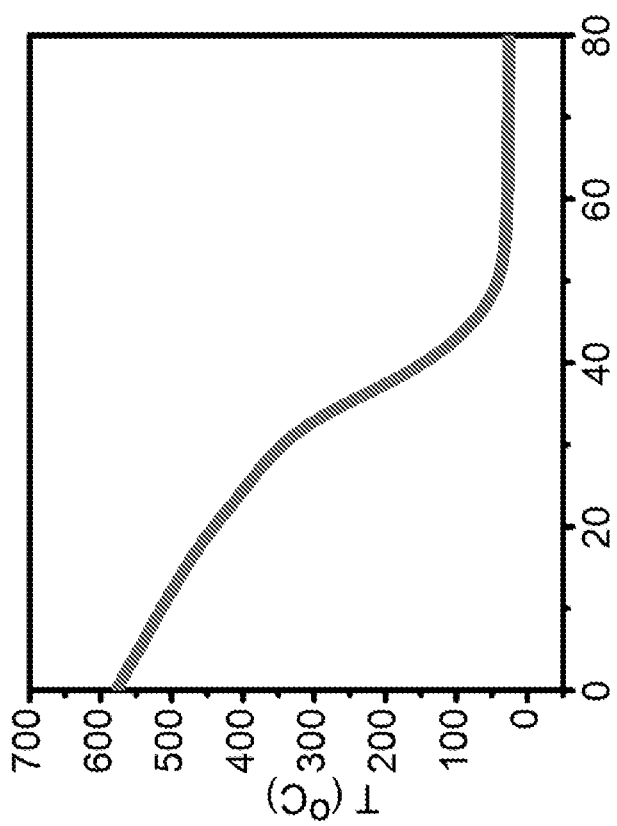
FIG. 1A shows a temperature profile in a 3-zone vertical Bridgman furnace for crystal growth.

Inorganic perovskites doped with oxygen atoms and/or fluorine atoms and methods for making the doped perovskites are provided. Also provided are radiation detectors incorporating the doped perovskites as photoactive layers and methods of using the radiation detectors to detect hard radiation, such as X-rays, gamma rays, and/or alpha particles.

The perovskites have the general formula $CsAX_3$, the chemical formula $RbAX_3$, or the chemical formula $Cs_{1-x}Rb_xPbX_3$ where 0<x<1, and a standard or distorted perovskite structure, where A is Pb or a combination of Pb with one or more additional elements selected from the IVA Group of the Periodic Table of the Elements, and X represents one or more halogen atoms. Examples of A atoms include Si, Sn, Ge, and Pb atoms. If A comprises more than two kinds of elements from the IVA Group, the molar ratio of the A elements to Cs is 1:1. By way of illustration, if A represents Pb and one additional element from Group IVA, the general formula above can be represented by the formula $Cs(A_{1-x}A'_x)X_3$, where A represents Pb and A' represents the additional element. Similarly, if X comprises more than one kind of halogen, the molar ratio of halogen elements to Cs is 3:1. Thus, if the perovskite includes more than one halogen, the general formula above can be represented by the formula $CsA(X_{3-x}X'_x)$, where X and X' represent two different halogen atoms. Finally, if the perovskite includes one additional Group IVA element and two different halogen atoms, the general formula above can be represented by the formula $Cs(A_{1-x}A'_x)(X_{3-x}X'_x)$, where A represents Pb, A' represents the additional Group IVA element, and X and X' represent two different halogen atoms.

The doped perovskites can be made by forming a mixture of: (a) a perovskite having the chemical formula $CsAX_3$, the chemical formula $RbAX_3$, or the chemical formula $Cs_{1-x}Rb_xPbX_3$ where $0<x<1$, where A represents Pb, Sn, Si, Ge, or a combination of two or more thereof, and X represents one or more halogen atoms; and (b) a compound that serves as an oxygen dopant source and/or a compound that serves as a fluorine dopant source. This mixture is then heated to form a melt, which is then crystallized. During the crystallization of the melt, oxygen atoms or fluorine atoms from the dopant source compounds are incorporated into the perovskite crystal lattice to provide a perovskite that is doped with oxygen atoms and/or fluorine atoms. Thus, the compounds are doped compounds, rather than new alloys. Moreover, because the dopants are incorporated into the interior of the crystal and not only on the exterior surface or on the surfaces of grains in a polycrystalline material, the crystals are not just surface-passivated by the dopant atoms. The doped perovskites may be single-crystalline or polycrystalline. However, in either case, the dopant atoms are incorporated into the bulk lattice of the crystal. In addition, because the doping process does not depend on oxygen or fluorine diffusion into a pre-fabricated crystal, the process can provide uniform doping throughout the bulk of large single-crystals of the perovskites, including crystals having thicknesses of 0.1 mm, 0.5 mm, 1 mm, or even greater. The doped $CsAX_3$, $RbAX_3$, or $Cs_{1-x}Rb_xPbX_3$ perovskite can be produced as the sole crystallization product or can be produced in the form of a solid-state solution that includes one or more congeners of the $CsAX_3$, $RbAX_3$, or the $Cs_{1-x}Rb_xPbX_3$ perovskite.

The concentration of the dopant source compounds in the mixture from which the perovskite is crystallized is desirably low enough to avoid the precipitation of lead oxides, lead fluorides, or other dopant source compounds as a second phase in the crystallized doped perovskite, that is—the concentration of dopant source compounds is desirably low enough to produce a single-phase doped perovskite. Although the concentration of a dopant source compound that will cause precipitation of a second phase will depend on the particular perovskite starting material and dopant source compounds being used, generally a dopant source compound concentration of 1 mol. % or lower is sufficient to prevent the formation of a two-phase product. This includes embodiments of the mixtures in which the mol. % of dopant source compound is 0.5 mol. % or lower or lower or 0.3 mol. % or lower, and further includes embodiments of the mixtures in which the mol. % of dopant source compound is 0.1 mol. % or lower. By way of illustration only, mixtures having a dopant source concentration (for example, a PbO concentration or a $PbF_2$ concentration) in the range from about 0.01 mol. % to 0.3 mol. %, including in the range from 0.02 mol. % to 0.1 mol. %, can be used.

The compound that provides a source of oxygen or fluorine dopants (referred to herein as a "dopant source compound") may be any lead-containing compound which can introduce oxygen or fluorine as an impurity into the lattice of the $CsAX_3$ or the $Cs_{1-x}Rb_xPbX_3$ perovskites. By way of illustration, suitable oxygen dopant source compounds include lead oxides, such as PbO, $Pb_3O_4$ and $PbO_2$, and other compounds that include both lead and oxygen and that decompose into lead oxides upon heating. Examples of compounds that include both oxygen and lead that decompose to form lead oxides include $Pb(OH)_2$, $PbCO_3$, and $Pb_2(OH)_2CO_3$). The compounds $Pb(OH)_2$, $PbCO_3$, and $Pb_2(OH)_2CO_3$ can be formed via the oxidation of other lead-containing compounds, such as $PbBr_2$. A single dopant source compound can be used, or a combination of two or more dopant source compounds can be used. By way of further illustration, suitable fluorine dopant source compounds include lead fluorides, such as $PbF_2$, tin fluorides, such as $SnF_2$, and other compounds that include both lead and fluorine and that decompose into lead fluorides upon heating.

The doped perovskites can be grown as large single crystals by solid state solidification methods including the vertical Bridgman method, the horizontal freezing method, the Czochralski method, a top-seeded flux method, or a narrow zone refining method to reduce production cost and yield crystal boules with large volumes. However, the growth methods are not limited to solid state solidification methods. Other suitable methods include low-temperature solution methods, chemical vapor transport methods, physical vapor transport methods, and the like. In some growth methods, the doped perovskites are grown as single crystals by solid state solidification methods without the use of a fluxing agent to get a high impurity grade. However, the solid-state solidification methods can be carried out with the assistance of fluxing agents to make the crystallization temperature even lower.

Hard radiation detectors that utilize the extrinsically oxygen- and/or fluorine-doped $CsAX_3$, $RbAX_3$, or $Cs_{1-x}Rb_xPbX_3$ perovskites described herein as a photoactive layer have improved energy resolution, carrier mobility-lifetime product, and/or improved compositional uniformity (yield ratio), relative to hard radiation detectors that utilize the corresponding intrinsic $CsAX_3$, $RbAX_3$, or $Cs_{1-x}Rb_xPbX_3$ perovskites as a photoactive layer. Moreover, the doping may provide an enhancement in photoluminescence (PL) intensity and/or a prolongment of photoluminescence emission decay time (e.g., $\geq 100$ ns), due to enhanced lattice integrity and carrier lifetime, which can be attributed to the doping. Without intending to be bound to any particular theory of the invention, it is proposed that the reduction in halogen atom (e.g., Cl and/or Br) vacancies in the crystals by the incorporation of the dopant atoms into the lattice can account, at least in part, for the improved properties. By way of illustration, photoluminescence decay times of at least 500 ns, at least 1000 ns, and at least 2000 nm can be provided. For example, decay times in the range of 500 ns to 2800 ns can be achieved. Such improvements can be realized, for example, for perovskites having a molar ratio of O impurity (i.e., oxygen atom dopant) or F impurity (i.e., fluorine atom dopant) to $CsAX_3$, $RbAX_3$, or $Cs_{1-x}Rb_xPbX_3$ of, for example, 1 ppm or greater, including 10 ppm or greater, and 100 ppm or greater. For example, oxygen atom dopant and/or fluorine atom dopant concentrations in the range from approximately 1 ppm to 10000 ppm can be used.

Without intending to be bound to any particular theory behind the various inventions described herein, the inventors propose that the doping of the perovskites passivates dominant deep energy levels that would otherwise trap electron/hole pairs and hinder the attainment of high yields and charge collection efficiency. The inventors also propose that the dominant deep energy levels can be passivated or eliminated by the extrinsic doping. As a result, the extrinsic doping of the perovskites can provide a higher compositional homogeneity and improved energy resolution performance, associated with a yield increase of up to 80%.

One example of a hard radiation detector that can be fabricated using the doped perovskites includes the following components: (a) a photoactive layer comprising an oxygen-doped and/or fluorine-doped perovskite having the chemical formula $CsAX_3$, the chemical formula $RbAX_3$, or the chemical formula $Cs_{1-x}Rb_xPbX_3$ where $0<x<1$, wherein A represents Pb or a combination of Pb and one or more of Sn, Si, and Ge, and X represents one or more halogen atoms, and further wherein the oxygen dopants and fluorine dopants are incorporated into the crystal lattice of the perovskite; (b) a first electrode in electrical communication with the photoactive layer; (c) a second electrode in electrical communication with the photoactive layer, wherein the first and second electrodes are configured to apply an electric field across the photoactive layer; and (d) a signal detector configured to measure a photocurrent generated in the photoactive layer when the photoactive layer is exposed to ionizing incident radiation.

When the incident radiation is absorbed by the doped perovskite, electron-hole pairs are formed, and a photocurrent is generated. The devices can further comprise one or more additional electronic components configured to measure the photocurrent. The incident radiation can comprise particle radiation, such as alpha particle radiation, or electromagnetic radiation, such as gamma radiation (i.e., wavelengths in the range from about $1 \times 10^{-10}$ to about $2 \times 10^{-13}$ meters), and/or X-ray region radiation (i.e., X-ray energy in the range of 1 keV-100 keV, which corresponds roughly to wavelengths of 0.01 nm-1 nm).

At least one of the first and second electrodes is desirably at least partially transparent to the incident radiation. Electrodes may comprise, for example, an electrically conductive oxide, such as FTO, or a metal, such as gold or aluminum. When the incident radiation is absorbed by the doped perovskite, electron-hole pairs are generated and drift toward their respective electrodes under the applied electric field. Electron or hole photocurrents can be measured separately by changing the bias direction. The device may further include a signal amplifier to amplify the photocurrent signal generated by the photodetector, a processor, data storage (e.g., a computer-readable medium), and an output interface, such as a computer interface. The computer-readable medium is an electronic holding place or storage for information so the information can be accessed by the processor as understood by those skilled in the art. The computer-readable medium can include, but is not limited to, any type of random-access memory (RAM), any type of read only memory (ROM), any type of flash memory (such as magnetic storage, optical disks, digital versatile disc (DVD), etc.), smart cards, flash memory devices, etc. The processor executes instructions that may be carried out by a special purpose computer, logic circuits, hardware circuits, or other methods. The processor may be implemented in hardware and/or firmware. The processor executes an instruction, meaning it performs/controls the operations called for by that instruction. The term "execution" is the process of running an application or the carrying out of the operation called for by an instruction. The instructions may be written using one or more programming language, scripting language, assembly language, etc. The processor can be operably coupled with the computer-readable medium and an output interface that is configured to receive, to send, to display, and/or to otherwise process the signal generated by the photodetector. For example, the processor, computer-readable medium, and output interface may be configured to generate a graphical display of the measured photocurrent.

EXAMPLE

This example illustrates the growth of oxygen-doped $CsPbBr_3$ and oxygen-doped $CsPbBr_{3-x}Cl_x$ crystals using PbO as a dopant source compound, as well as fluorine-doped $CsPbBr_3$. The use of the oxygen-doped $CsPbBr_3$ as a photoactive layer in a hard radiation detector is also illustrated.

Experimental Section

Reagents. The chemicals used in this invention include: (1) CsBr powder, 99.999% purity, Alfa Aesar; (2) $PbBr_2$, 99.999% purity, Alfa Aesar; (3) PbO powder, 99.999% purity, Alfa Aesar; (4) Pb rods, 99.999% purity, Alfa Aesar. This sample was left in air for 1 month until the shiny metallic surface became gray. (5) $PbO_2$ powder, 99.999% purity, Alfa Aesar. (6) Photodegraded $PbBr_2$ powder. The white 5N purity $PbBr_2$ powder was left in air and illuminated by an incandescent light for 2 weeks until the color turned dark.

Synthesis, purification, and crystal growth. Polycrystalline $CsPbBr_3$ raw material was synthesized by the direct chemical reaction of 106.405 g CsBr (0.50 mol) and 183.505 g $PbBr_2$ (0.50 mol) precursors with the stoichiometric ratio of 1:1 in a fused silica tube with an inner diameter of 22 mm, which was flame sealed under vacuum. The synthesis was performed at 650° C. for 48 h in a temperature-programmed rocking furnace to ensure complete reaction, followed by slow cooling at a rate of 20° C. $cm^{-1}$ to room temperature. The resultant ternary product was not subject to any purification process. After synthesis, 25 g $CsPbBr_3$ raw material with certain concentrations of PbO as a dopant source compound was loaded into conical-tip quartz ampoules with a thickness of 1.5 mm and an inner diameter of 10 mm, respectively. The concentration of dopant source compound PbO added to the $CsPbBr_3$ raw material varied from 0.00%, 0.01%, 0.05%, 0.10%, 0.30%, 0.50% to 1% (i.e., from 0.01 mol. % to 1 mol. %) in molar ratio. Subsequently, these ampoules were sealed at a vacuum level of $3 \times 10^4$ mbar. The crystal growth was performed in a vertical 3-zone Bridgman furnace. (Bridgman, P. W. et al., *Proceedings of the American Academy of Arts and Sciences* 1925, 60 (6), 305-383.) Prior to actual crystal growth, the tube was held still in the hot zone of the Bridgman furnace for 12 h to ensure complete melting. Subsequently, the ampoule was translated downward from the upper zone (580° C.), to the middle zone (500° C.), to the cold zone (380° C.) at a slow translation speed of 0.5 $mm·h^{-1}$ and a temperature gradient of around 5.1° $C.·cm^{-1}$. After complete crystallization of the whole $CsPbBr_3$ flux, the ampoule was cooled down to room temperature at an increased dropping speed of 5.0 mm/h, which generated a cooling down rate of 5° C./h. All of the 6 boules made using various concentrations of a dopant source compound were grown one by one under the same furnace with identical temperature settings and translation speed.

Crystal processing and characterization. The pristine boules grown from furnace were sliced along the direction perpendicular to the growth direction using a diamond saw. Slices were extracted from the tip section to tail section of boule, and then polished with an 800-grit silicon carbide sandpaper. The final fine polishing was carried out using a cloth to get a super smooth wafer. PXRD analyses of ground specimen from crystals was performed using a calibrated (against NIST silicon) CPS 120 INEL diffractometer operating at 40 kV/20 mA (Cu $K_a$ graphite-monochromated radiation $\lambda$=1.5418 Å) and equipped with a position-sensitive detector with flat sample geometry. Simulated powder patterns from the single-crystal X-ray data were calculated using the PowderCell software package. (Kraus, W. N., G, *PowderCell* 2.3 1998.)

X-ray photoelectron spectroscopy measurements. X-ray photoelectron spectroscopy (XPS) measurements were conducted on a Thermo Scientific ESCALAB 250 Xi spectrometer equipped with a monochromatic Al Kα X-ray source (1486.6 eV) operating at 300 W. Samples were analyzed under ultra-high vacuum (P<$10^{-8}$ mbar) with a pass energy of 150 eV (survey scans) or 25 eV (high-resolution scans). All peaks were calibrated with C 1s peak binding energy at 284.7 eV for adventitious carbon. For $CsPbBr_3$ crystals, the exposed surface freshly cleaved from chunky crystals was adopted for measurements to avoid surface absorbed moisture and carbon dioxide, and the exposed surface was further etched by ion milling ($Ar^+$ ions). For oxidized Pb metal and photodegraded $PbBr_2$ samples, no surface etching was done as the focus was on surface oxidation layers on them.

Figure 2A:
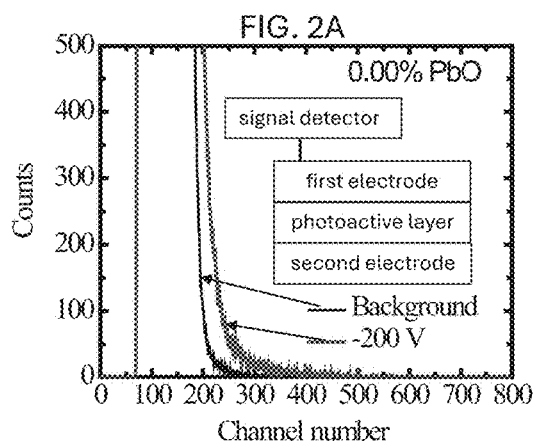
FIG. 2A shows a 122 keV γ-ray pulse height spectrum (hole-collection) of a planar device made from $CsPbBr_3$ crystals without oxygen doping.

Device fabrication. The polished $CsPbBr_3$ wafers with a dimension of ~5×5 mm$^2$ and a thickness of 1.00 mm were selected for fabricating detectors on a glass substrate. As the resistivity (~$10^{10}$ Ω·cm) of $CsPbBr_3$ is not sufficiently high to suppress background signal from dark current, a Schottky junction was applied to further suppress dark current from background holes. Since $CsPbBr_3$ crystal's conduction type is p type, Ga contact with a low work function was selected to establish a Schottky junction to block injection of holes from contact to semiconductor. Therefore, the top and bottom electrodes were made by applying Ga liquid metal and fast drying Au paint, respectively. The device works in reverse biases when detecting hard radiation to suppress leakage current. A glass substrate with Cu foil strips was used as the sample holder, and its Cu foil strips were bonded to the wafer's electrodes using 0.1 mm diameter Cu wires. A schematic diagram of an embodiment of a device for detecting radiation is shown in the inset of FIG. 2A.

Charge transport measurement. Direct current (DC) current-voltage (I-V) measurements in the dark were performed to assess the leakage current and estimate the resistivity. DC conductivity was measured on a Keithley 6517B electrometer and a Keithley 6105 resistivity adapter. Electromagnetic interference and photoconductive responses were eliminated by a metallic enclosure.

Hard radiation spectroscopy measurements. Spectral response of the $CsPbBr_3$ detectors with a thickness of 1.00 mm was performed using a homemade system including an eV-550 preamplifier box, a spectroscopy amplifier (ORTEC, Model 572A), and a computer installed multichannel pulse height analyzer (Model ASPEC-927). The final signals were read into the MAESTRO-32 software. γ-ray spectroscopy measurements were carried out in atmosphere, and the distance between the $^{57}$Co radiation source (~0.05 mCi) and detector was set to be ~12 cm. The optimal linear amplifier gain, amplifier shaping time, and recording time were 100, 2.0 μs, and 300 s, respectively. Pulse γ-ray height spectra without radiation source under biasing were collected as background noise under the same experimental conditions. For measurements under hole transport, incident γ-ray penetrated through the Ga contact which was grounded. The Au contact for charge collection was connected to the negative bias to ensure that the Schottky junction worked under a reverse bias. For measurements under electron transport, incident γ-ray penetrated through the Au contact which was grounded. The Ga contact for charge collection was connected to the positive bias to ensure that the Schottky junction still worked under a reverse bias.

Carrier mobility-lifetime product estimation. The most important figure of merit to evaluate the performance of semiconductor detector materials for their radiation detection efficiency is the carrier mobility-lifetime product, μτ. For the carrier mobility-lifetime product measurement, a setup similar to that described by A. Many, and further developed by Ruzin et al., was used to estimate the carrier mobility-lifetime product from the voltage dependence of γ-ray spectrum. (Many, A., *J Phys Chem Solids* 1965, 26 (3), 575-578; and Ruzin, A. et al., *J. Appl. Phys.* 1997, 82 (9), 4166-4171.) The mobility-lifetime product for electrons was derived from the analysis of charge collection efficiency (CCE) under each bias voltage applied to the sample. The charge collection efficiency (CCE) was linked to parameter V, the bias voltage applied to the sample, by the single-carrier Hecht equation:

$$CCE(V) = \frac{Q}{Q_0} = \frac{\mu\tau V}{L^2}\left(1 - e^{-\frac{L^2}{\mu\tau V}}\right), \quad (1)$$

where CCE(V) is the charge collection efficiency under the applied V, Q is the measured photopeak/shoulder channel number at bias V, L (0.10 cm) is the thickness of detector, and $Q_0$ refers to the theoretical saturated channel number of the photopeak. The mobility-lifetime product for electrons ($\mu_e\tau_e$) and $Q_0$ can be derived from the experimental data of CCE(V) and Q.

Photoluminescence and time-resolved photoluminescence decay time measurements: Spectral and time resolved measurements at room temperature were carried out for freshly cleaved $CsPbBr_3$ crystals without polishing using the Edinburgh Instruments FS5 spectrofluorometer. The FS system configuration consisted of an EPL405 pulsed diode laser excitation source with a wavelength of 405 nm, Time-correlated Single Photon Counting (TCSPC) lifetime option, and a photomultiplier (PMT)-980 detector. The $CsPbBr_3$ crystals were mounted into the sample holder module of SC-10. The emission slit width was set as 0.5 nm. A 495 nm long pass filter was adopted on the emission path to the detector. The PL data was collected from the emission range of 400 to 800 nm with 1 nm interval and 0.5 s dwell time. For PL decay time measurement, each decay was fit with a combination of two or three stretched exponentials using the FAST software package. The measured decay curves were fit with a sum of exponential functions of $f(t)=\Sigma_i A_i \exp(-t/\tau_i)+\gamma_0$, where $A_i$ is the amplitude, $\tau_i$ the decay time constant, and $\gamma_0$ the background. The average PL decay time was obtained by summing up the products of the decay component's decay time and relative light intensity. The samples were extracted from the tip section of the boules, and no further polishing was conducted in order to get the surface free of damaged layers due to mechanical polishing. The average PL decay time was obtained by summing up the products of the decay component's decay time and relative light intensity.

Results and Discussion

Figures 1B, 1C:
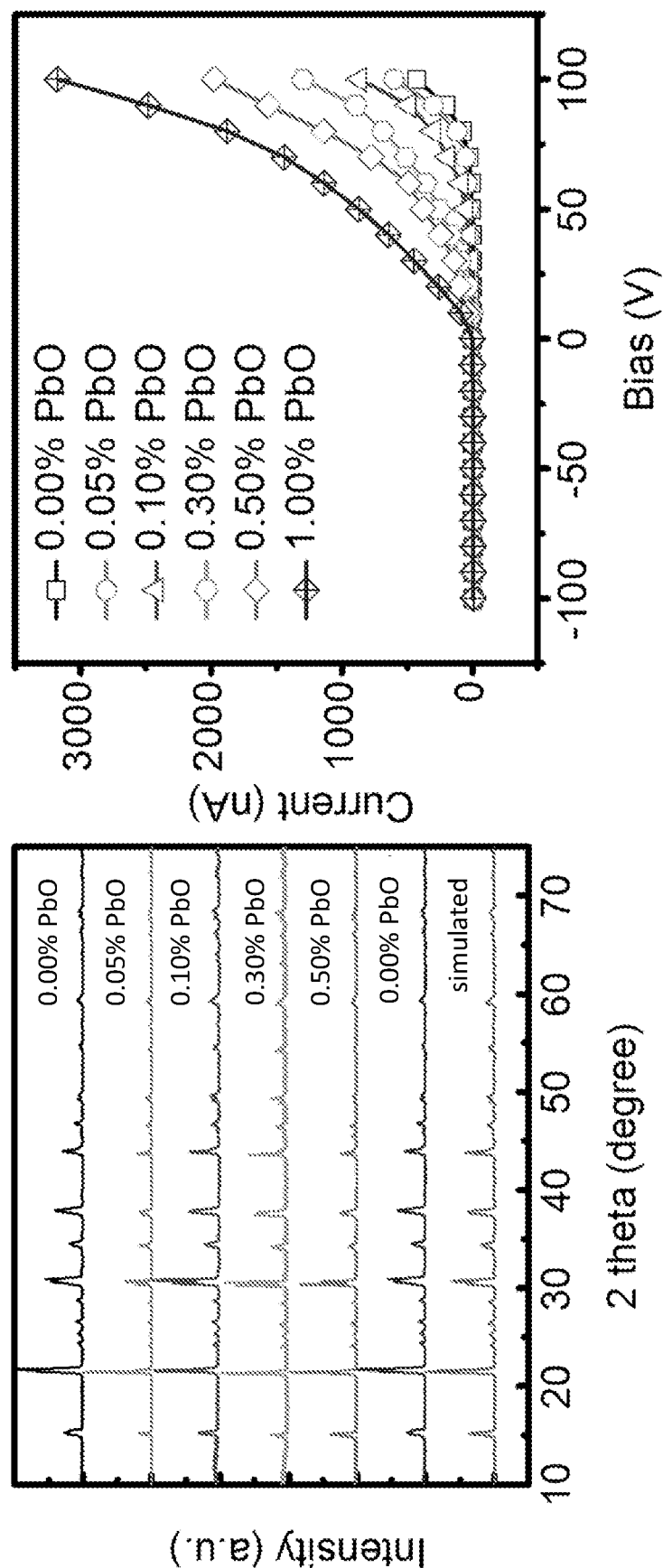
FIG. 1B shows powder X-ray diffraction (PXRD) patterns of the ground specimen from all boules made using different concentrations of PbO. The simulated pattern of $CsPbBr_3$ is from the orthorhombic room temperature phase belonging to the space group of Pnma.
FIG. 1C shows the current-voltage (I-V) curves of $CsPbBr_3$ crystals with a dimension of 4.0×4.0×1.0 mm³ with Ga contact (Schottky junction) and Au contact (Ohmic contact).

Crystal growth and compositional analysis. Crystal growth was carried out in a 3-zone vertical Bridgman furnace. FIG. 1A shows the temperature profile of the furnace along the length of the furnace, which provides a temperature gradient of 5.1° C./cm and a growth speed of 0.5 mm/h for crystallization. The yellow deposit found above the boule was due to vapor transport of $CsPbBr_3$ during the cooling down process of the ampoule. All the boules were transparent, free of cracks, and orange, which agrees with the bandgap 2.25 eV of $CsPbBr_3$. The boules made using PbO concentrations of 0.50% and 1.00% stuck with the inner wall of the fused ampoules due to the reaction between excessive dopant source compound PbO and fused silica, which formed $PbSiO_3$. The occurrence of the tube sticking indicates that the equilibrium solid solution of dopant source compound PbO into $CsPbBr_3$ lattice should be lower than 0.50%. As shown in FIG. 1B, compositional analysis from the ground specimen from all boules by PXRD reveals that no phase other than $CsPbBr_3$ was detectable. Since the $CsPbBr_3$ crystal has a p conduction type and an insufficient resistivity of $10^{10}$ Ω·cm, Ga liquid metal with a lower work function was chosen as the contact to build up the Schottky junction to further reduce dark current by blocking hole injection from contact to semiconductor. Au paint with a higher work function was selected as the contact to form Ohmic contact with the semiconductor. FIG. 1C exhibits the current-voltage (I-V) characteristics of crystals from all 6 boules made using different PbO concentrations at room temperature. All I-V curves show classic rectifying features, indicating that the Ga contact formed a Schottky junction with the $CsPbBr_3$ semiconductor. All the dark currents under reverse biases can be controlled to a low level below 10 nA at −100 V, which is sufficiently low for obtaining a γ-ray response with a high signal-noise ratio if devices detect γ-rays.

Figure 2B:
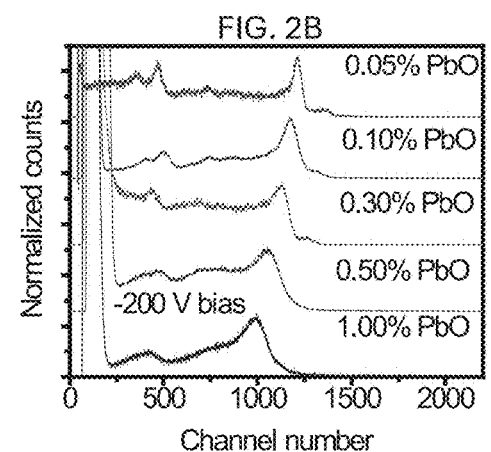
FIG. 2B shows 122 keV γ-ray pulse height spectra (hole-collection) of planar devices made from $CsPbBr_3$ crystals using concentrations of PbO.
Figure 2C:
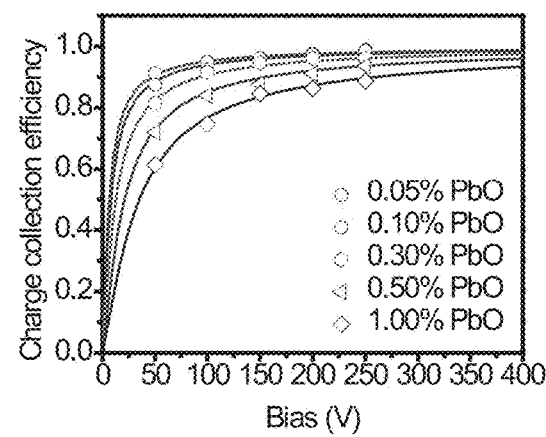
FIG. 2C shows hole collection efficiency as a function of applied bias for $CsPbBr_3$ crystals made using various PbO concentrations.
Figure 2D:
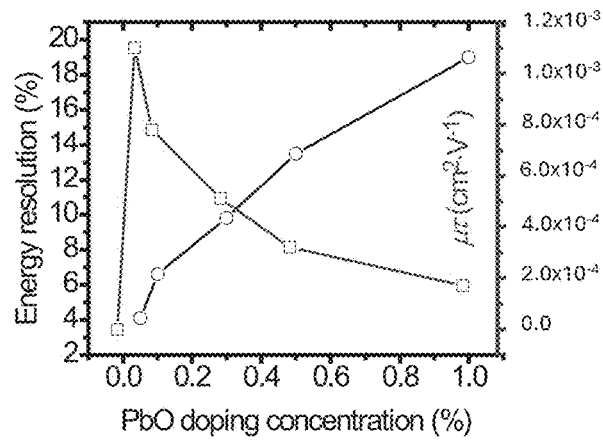
FIG. 2D shows energy resolutions against 122 keV γ-ray and hole mobility-lifetime products of $CsPbBr_3$ made using various PbO concentrations.
Figure 3A:
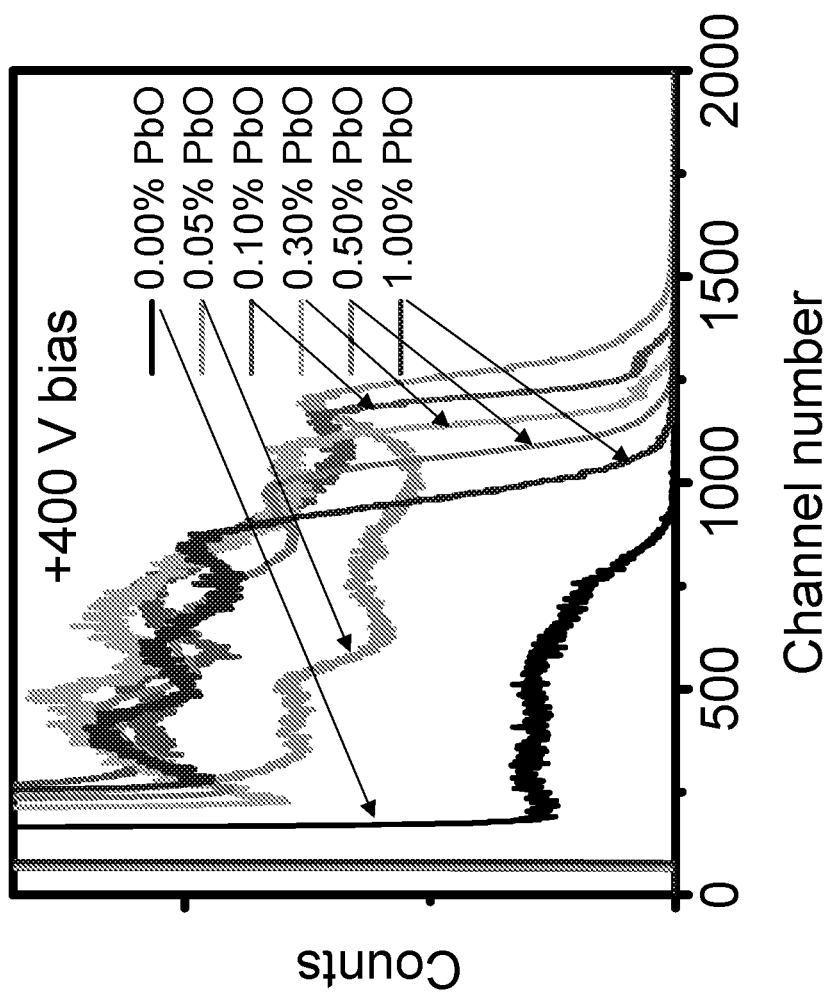
FIG. 3A shows 122 keV γ-ray pulse height spectra (electron collection) of planar devices made from $CsPbBr_3$ crystals made using various PbO concentrations.

Improvement on detection performance. The pulse height spectra against 122 keV γ-rays from the 0.05 mCi $^{57}Co$ radiation source of the detectors made from $CsPbBr_3$ crystals made using different PbO concentrations were measured. FIG. 2A shows the γ-ray spectral response from the planar device made from an undoped $CsPbBr_3$ crystal under hole-collection configuration (anode irradiation) at an applied voltage of −200 V. The device showed weak photoresponse under counting mode since the signal can be distinguished from the background noise; however, it did not resolve γ-rays. FIG. 3A shows the 122 keV γ-ray pulse height spectra under hole-collection configuration of planar devices made from $CsPbBr_3$ crystals made using PbO as a dopant source compound at various concentrations. All of the samples made using PbO as a dopant source compound resolved 122 keV γ-rays, as the full-energy photopeaks can be observed. As shown in Table 1, the energy resolution achieved the best at 4.1% when using PbO as a dopant source compound at a concentration of 0.01%, and then gradually degraded to 19.0% at 1.0% PbO concentration, indicating that the optimal concentration of PbO to achieve the best energy resolution is closer to 0.05%. The peak channel number of full-energy photopeak decreased with increasing PbO concentrations, given that the hole collection efficiency decreased, as shown in FIG. 2B. Excess PbO may not be incorporated into the $CsPbBr_3$ lattice. On the contrary, excess PbO may exist as second phase in crystal, acting as a carrier scattering center, which in turn decreases hole collection efficiency. The most important figure of merit to evaluate the performance of semiconductor detector materials for their radiation detection efficiency is the carrier mobility-lifetime product, µτ. FIG. 2C shows the hole collection efficiency as a function of applied voltage. The hole mobility-lifetime product $\mu_h\tau_h$ of the oxygen-doped perovskite made using 0.05% PbO achieved a maximum of $1.0\times10^{-3}$ cm²/V, while gradually dropping down to a minimum of $1.7\times10^{-4}$ cm²/V when PbO was used at the dopant source at a concentration of 1.00% (FIG. 2D). This trend agrees well with that for energy resolution against γ-ray. Remarkably, the hole $\mu_h\tau_h$ for 1.00% concentration maintained the order of $10^{-4}$ cm²/V even though the PbO concentration was much higher than the solid solubility limit of PbO in the $CsPbBr_3$ lattice, which is believed to be lower than 0.50%. In summary, oxygen doping using the compound PbO as an oxygen dopant source leads to the occurrence of energy resolutions and great improvement on $\mu_h\tau_h$.

Figure 3C:
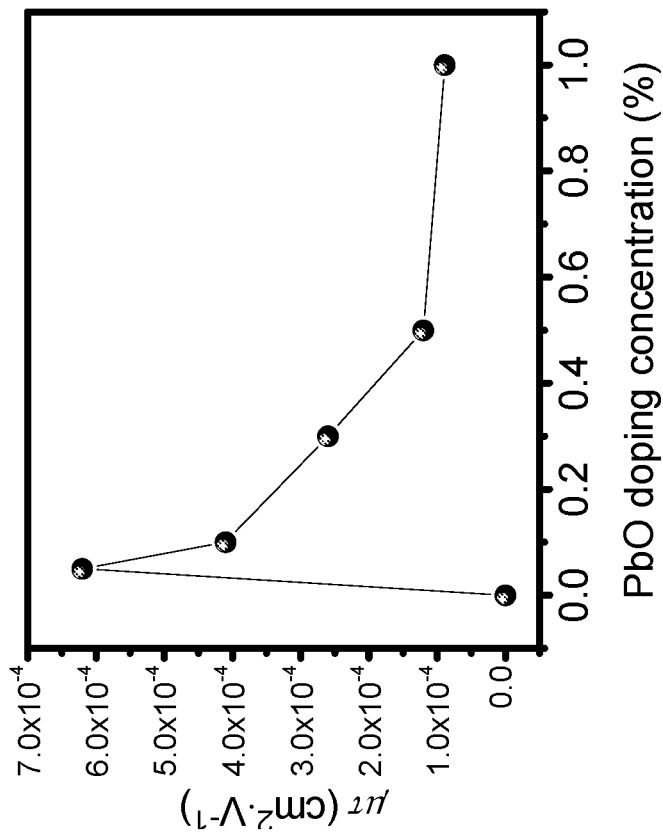
FIG. 3C shows electron mobility-lifetime products of $CsPbBr_3$ made using various PbO concentrations.
Figure 3B:
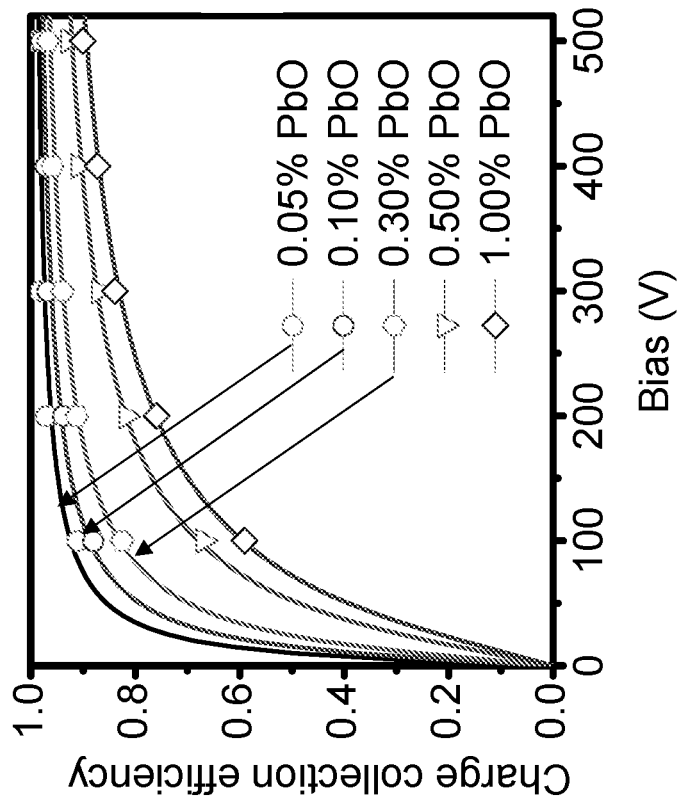
FIG. 3B shows electron collection efficiency as a function of applied bias for $CsPbBr_3$ crystals made using various PbO concentrations.

The detection performance under electron-collection configuration (cathode irradiation) was also measured and estimated. FIG. 3A shows the γ-ray spectral response from the planar device made from a $CsPbBr_3$ crystal without oxygen doping under electron-collection configuration at an applied voltage of +400 V. The device detected γ-rays under counting mode without energy resolution. However, the sample made using 0.05% PbO as an oxygen dopant source was able to resolve 122 keV γ-rays with an energy resolution of 11.3% and an electron mobility-lifetime product of $6.2\times10^{-4}$ cm²/V. Compared to the hole mobility-lifetime product $1.0\times10^{-3}$ cm²/V for the sample made using 0.05% PbO as a dopant source (FIGS. 3B and 3C), the electron transport was inferior to the hole transport, indicating the hole transport was dominant in $CsPbBr_3$ material. Similar to the trend of dropping hole mobility-lifetime product with increasing dopant source compound concentrations, the electron mobility-lifetime product also gradually degraded from $6.2\times10^{-4}$ cm²/V at a dopant source compound concentration of 0.05% to $9.0\times10^{-5}$ cm²/V at 1.00% dopant source compound concentration.

TABLE 1

The energy resolutions and carrier mobility-lifetime products for oxygen-doped $CsPbBr_3$ made using various concentrations of PbO as a dopant source compound.

| PbO concentration | Energy resolution for hole transport | Hole mobility-lifetime products (cm²/V) | Energy resolution for electron transport | Electron mobility-lifetime products (cm²/V) |
| --- | --- | --- | --- | --- |
| 0.00% | No energy resolution | <10⁻⁵ | No energy resolution | <10⁻⁵ |
| 0.05% | 4.1% | 1.0 × 10⁻³ | 11.3% | 6.2 × 10⁻⁴ |
| 0.10% | 6.6% | 7.8 × 10⁻⁴ | 15.3% | 4.0 × 10⁻⁴ |
| 0.30% | 9.8% | 5.1 × 10⁻⁴ | >20% | 2.6 × 10⁻⁴ |
| 0.50% | 13.5% | 3.2 × 10⁻⁴ | >20% | 1.2 × 10⁻⁴ |
| 1.00% | 19.0% | 1.7 × 10⁻⁴ | >20% | 9.0 × 10⁻⁵ |

Figure 4A:
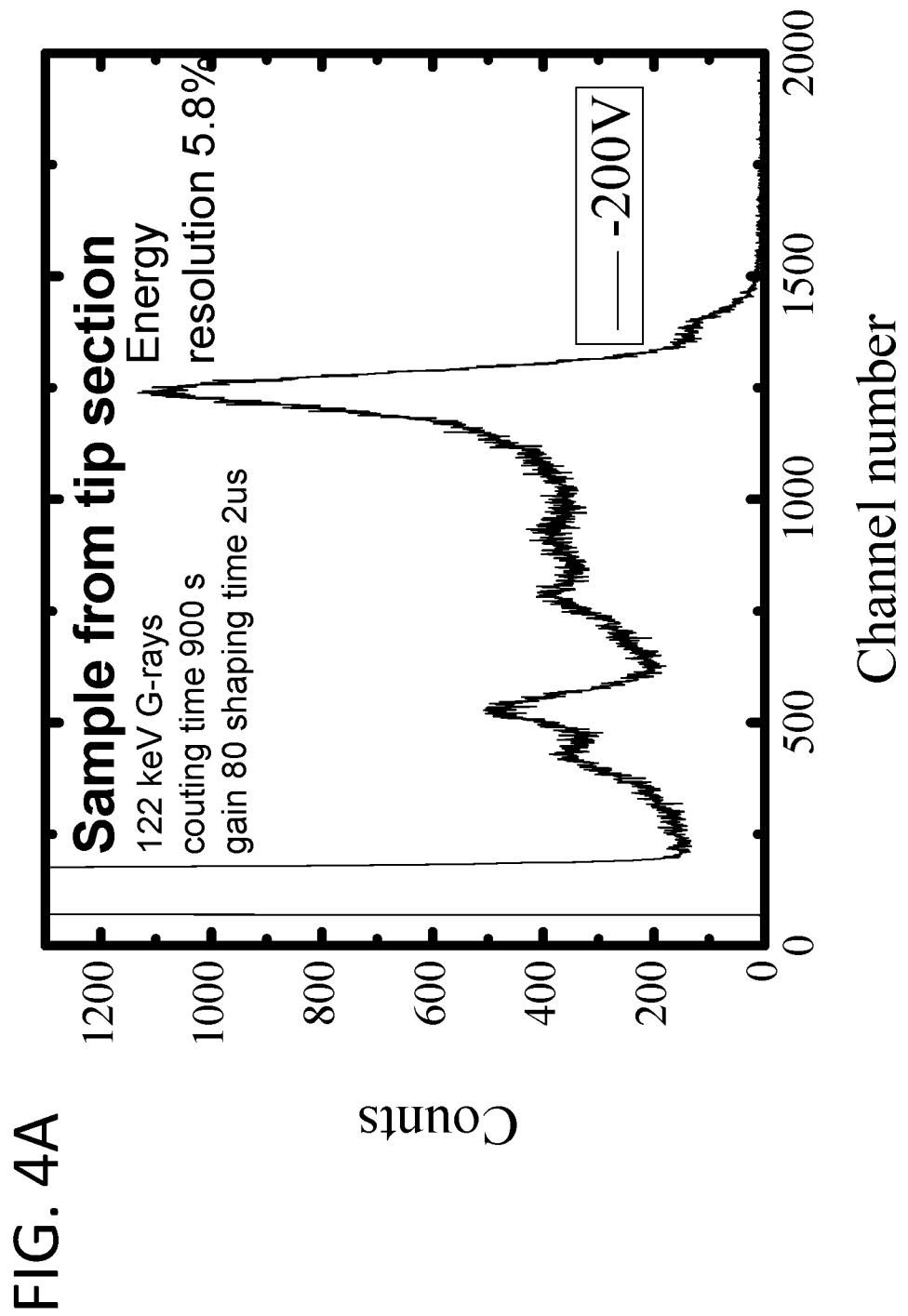
FIGS. 4A-4C show 122 keV γ-ray pulse height spectra (hole-collection) of planar devices made from $CsPbBr_3$ crystals extracted from (FIG. 4A) the tip section.
Figure 4B:
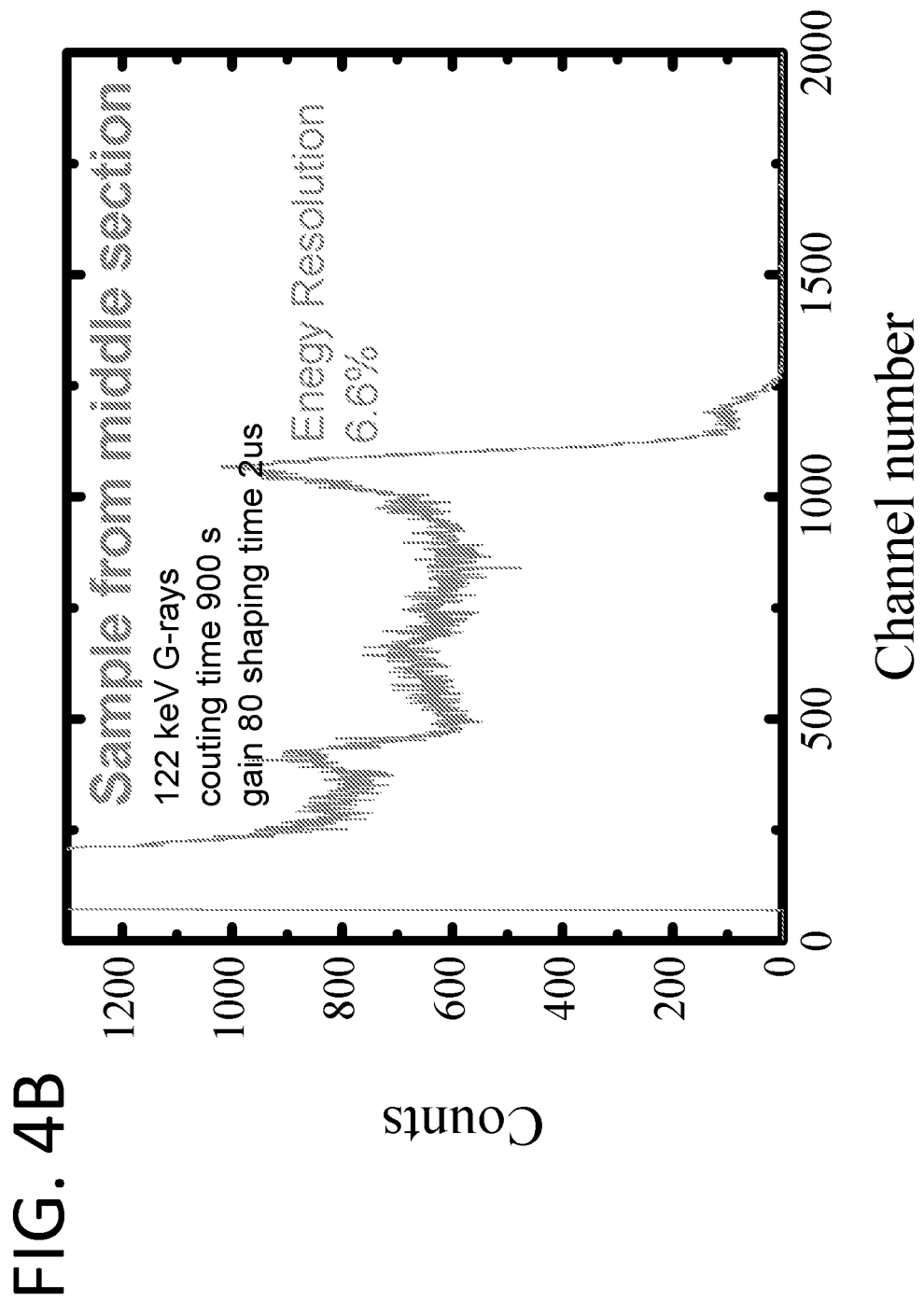
Figure 4C:
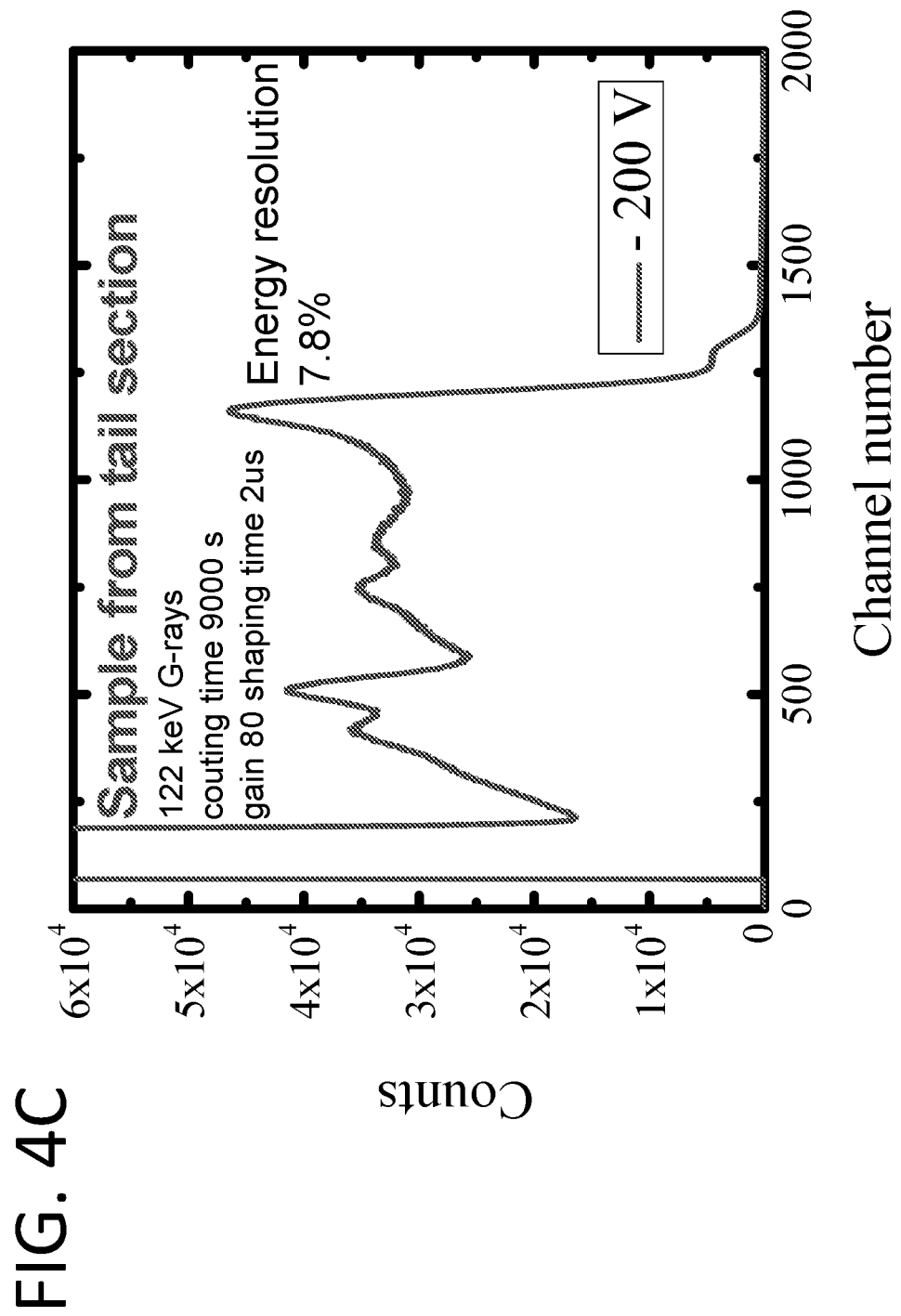

Improvement on yield ratio. The oxygen doping by a trace-amount of dopant source compound PbO not only greatly enhanced detection performance, but also improved yield ratio of crystals grown by the Bridgman method. FIGS. 4A-4C show 122 keV γ-ray pulse height spectra (hole-collection) of planar devices made from a $CsPbBr_3$ crystal extracted from (FIG. 4A) the tip section; (FIG. 4B) the middle section; and (FIG. 4C) the tail section of the boule that was made using PbO as a dopant source compound at a concentration of 0.10%. All 3 samples resolved 122 keV γ-ray with energy resolutions ranging from 5.8% to 7.8%, indicating high compositional homogeneity along the growth direction of the boule in detection performance. The general yield ratio increased to around 80% by oxygen doping. The oxygen doping may introduce uniform distribution of O impurity in the lattice, which is believed to be able to passivate the main deep level trapping/killing electron-hole pairs.

XPS analysis. It was assumed that oxygen doping introduces O impurity incorporated into the $CsPbBr_3$ lattice and then leads to passivation of the main deep level. In order to confirm the possible incorporation of 0 impurity into the lattice, XPS analysis on the binding energy of O1s was carried out. As shown in FIGS. 5A-5D and Table 2, compared to binding energies from Br 3d, Pb 3d, and Cs 4d electrons from undoped $CsPbBr_3$, the sample made using PbO as a dopant source compound at a concentration of 0.05% PbO showed nearly identical binding energies from these electrons. However, the signal of O1s could be observed in the oxygen doped sample while absent in the undoped sample, revealing that O impurity was present in the oxygen doped sample. The binding energy (533.0 eV) of O1s electron from the oxygen doped sample was different from those made using PbO as a dopant source compound, indicating that the oxygen impurity existing in the oxygen doped sample was not of the PbO phase. Since the binding energy (533.0 eV) of O1s electron from the oxygen doped sample was very close to that (533.1 eV) from $H_2O$, there is one possibility that surface moisture can introduce the 533.0 eV peak. However, considering that the XPS scanning was carried out on a freshly cleaved surface after etching by $Ar^+$ ions, the above possibility can be excluded. Therefore, the 533.0 eV can be ascribed to O impurity incorporated into the $CsPbBr_3$ lattice, but not from PbO or surface absorbed moisture.

Figure 5A:
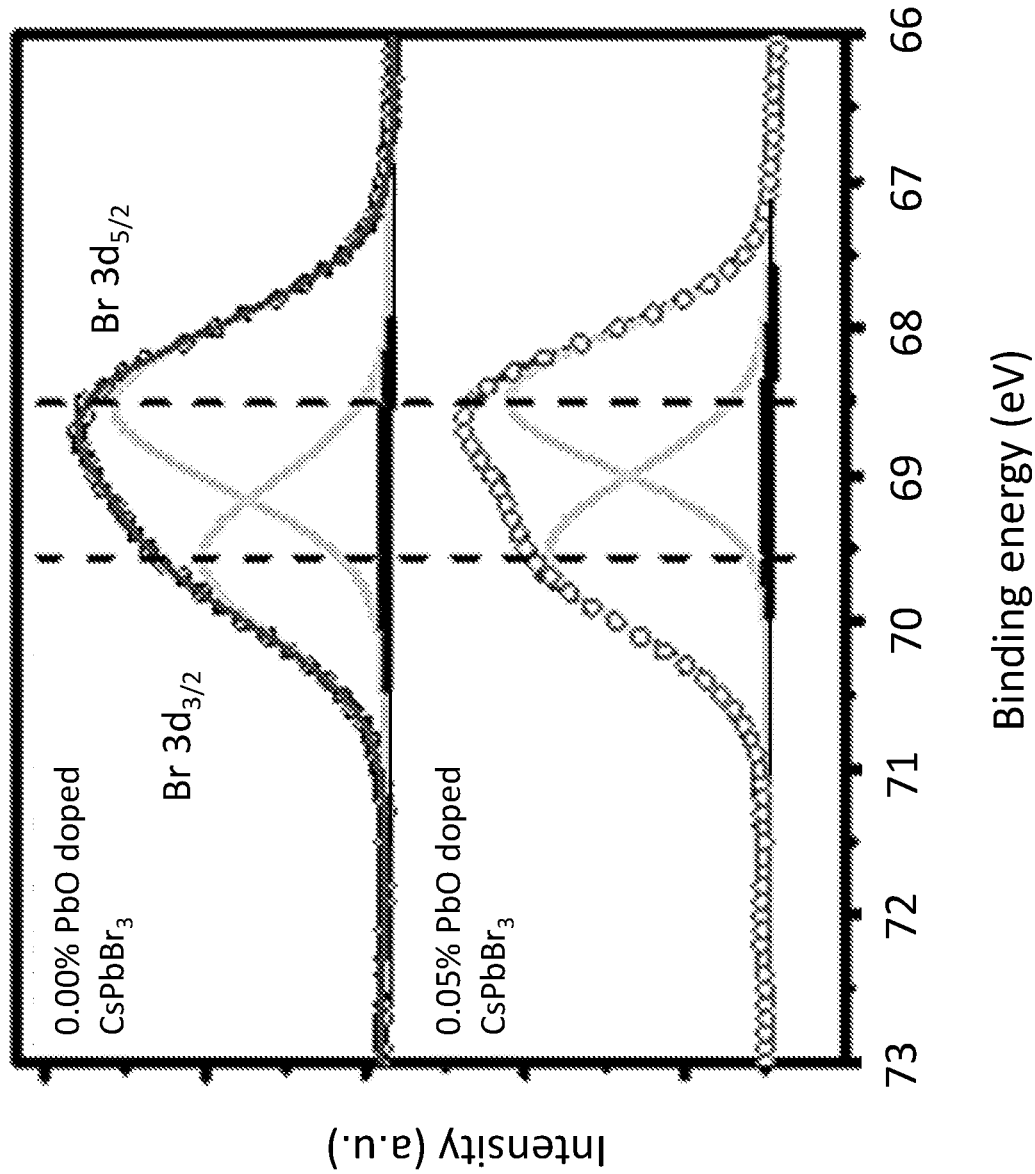
FIGS. 5A-5D show X-ray photoelectron spectra of (FIG. 5A) Br 3d electrons from undoped $CsPbBr_3$ and $CsPbBr_3$ made using 0.05% PbO as a dopant source compound.
Figure 5B:
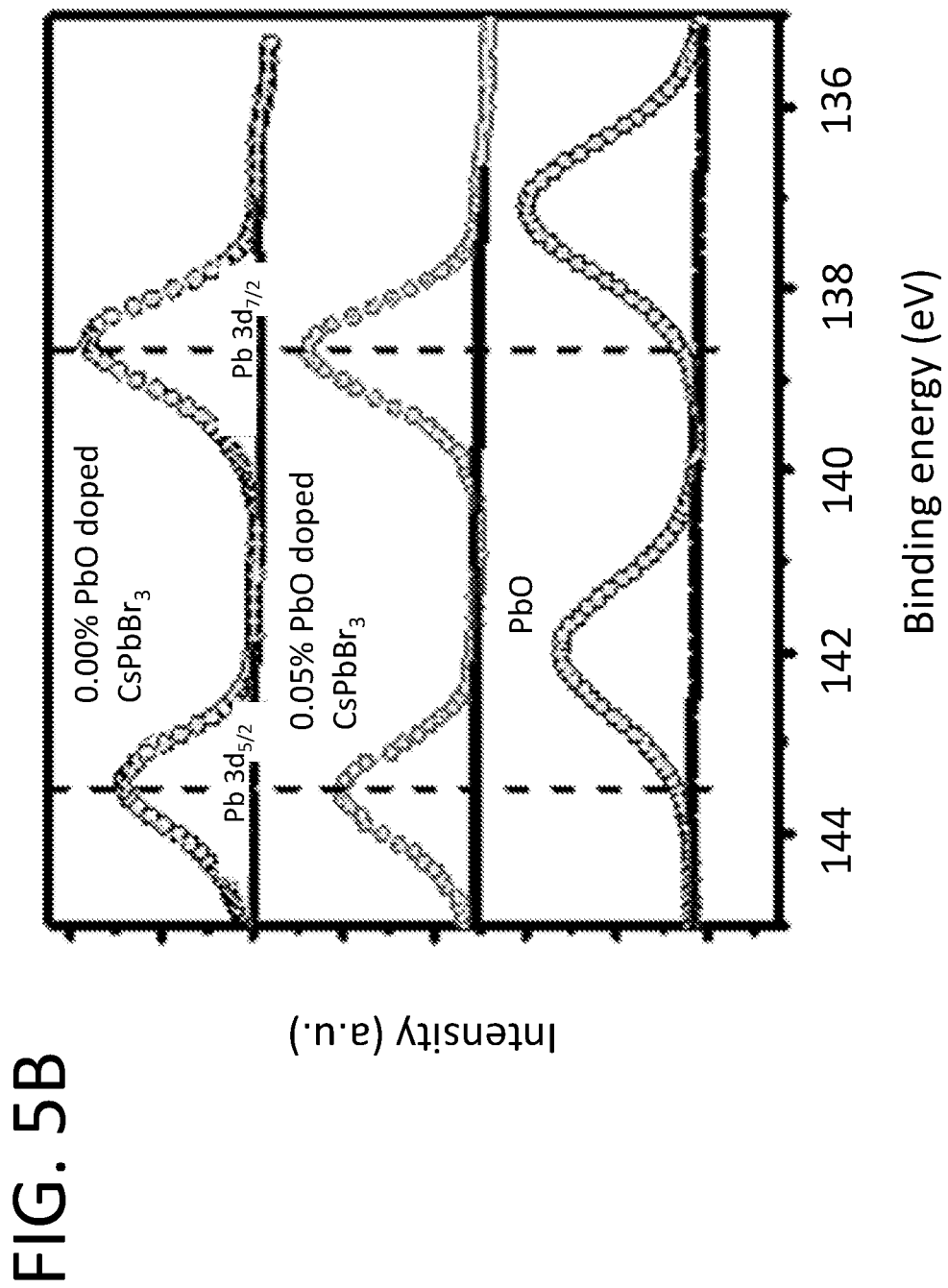
Figure 5C:
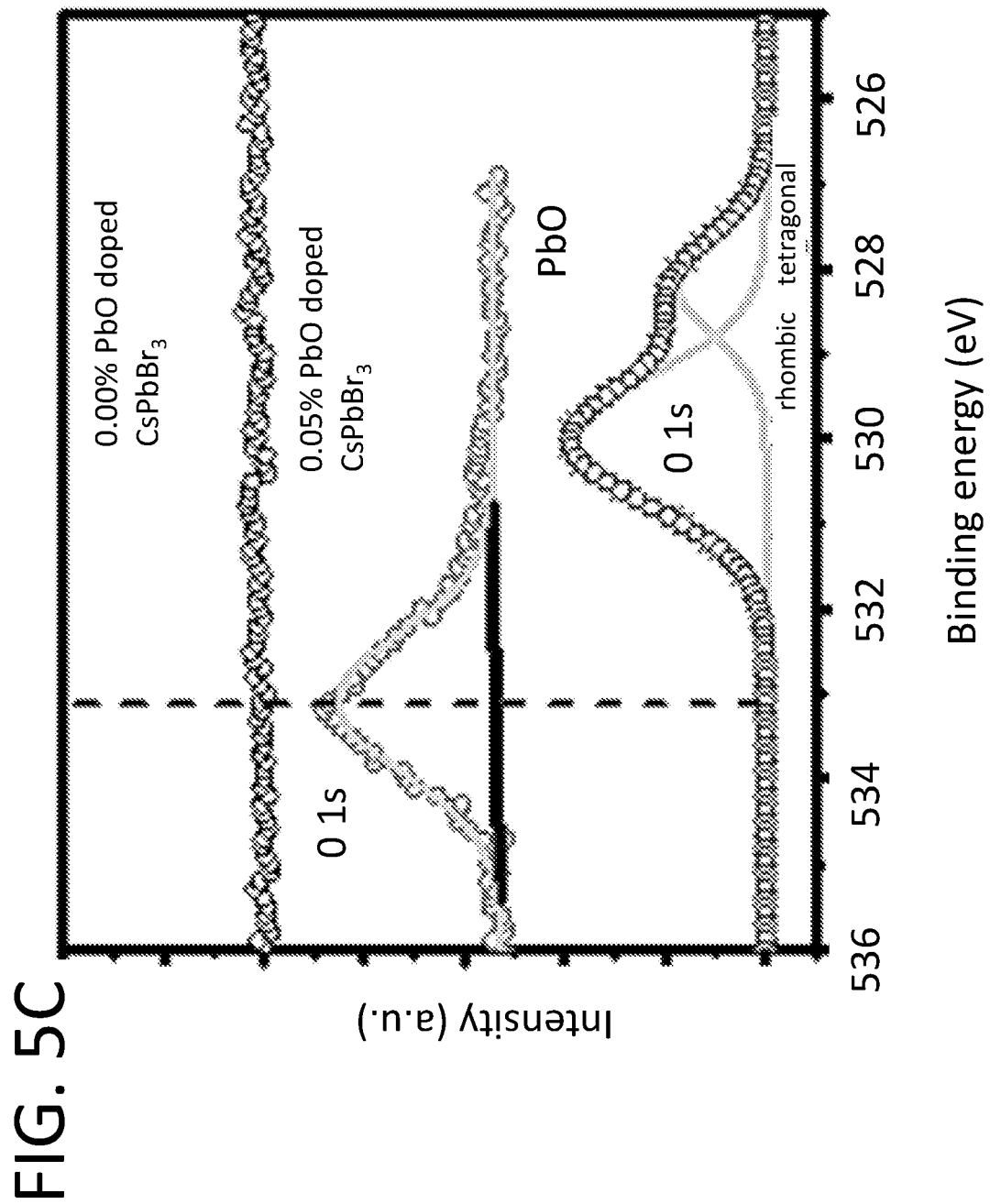
Figure 5D:
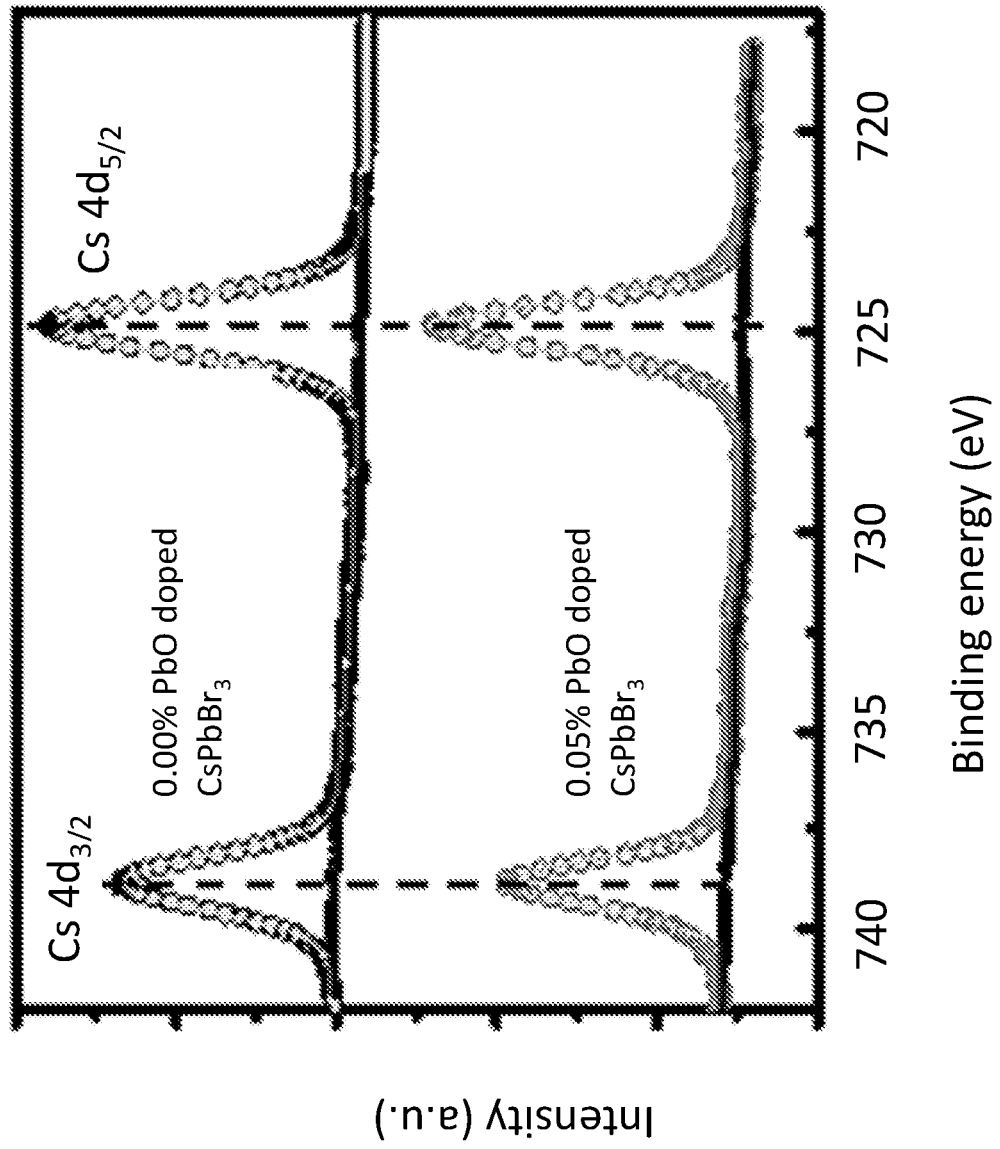

As shown in FIG. 5C, the broad signal peak of O1s electron from oxygen-doped $CsPbBr_3$ made using PbO as a dopant source can be split into two separating peaks with 529.7 and 527.8 eV binding energy, respectively. These two peaks can be ascribed to the O1s electron from rhombic-phase (high temperature phase) PbO and tetragonal-phase (room temperature phase) PbO, respectively. These two distinct O1s binding energies reveal that PbO is the mixture of rhombic-phase and tetragonal-phase PbO. Therefore, the phase of PbO is not just limited to the rhombic phase.

TABLE 2

Binding energies of electrons in undoped $CsPbBr_3$, $CsPbBr_3$ made using 0.05% PbO as a dopant source, and PbO.

| Electron binding energy (eV) | Undoped $CsPbBr_3$ | CsPbBrs made using 0.05% PbO as a dopant source | PbO |
|---|---|---|---|
| Br $3d_{3/2}$ | 69.5 | 69.5 | |
| Br $3d_{5/2}$ | 68.5 | 68.5 | |
| Pb $3d_{5/2}$ | 143.5 | 143.5 | 142.0 |
| Pb $3d_{7/2}$ | 138.6 | 138.6 | 137.2 |
| O1s | No signal | 533.0 | 529.7 and 527.8 |
| Cs $4d_{3/2}$ | 738.9 | 738.9 | |
| Cs $4d_{5/2}$ | 724.9 | 724.9 | |

Figures 6A, 6B:
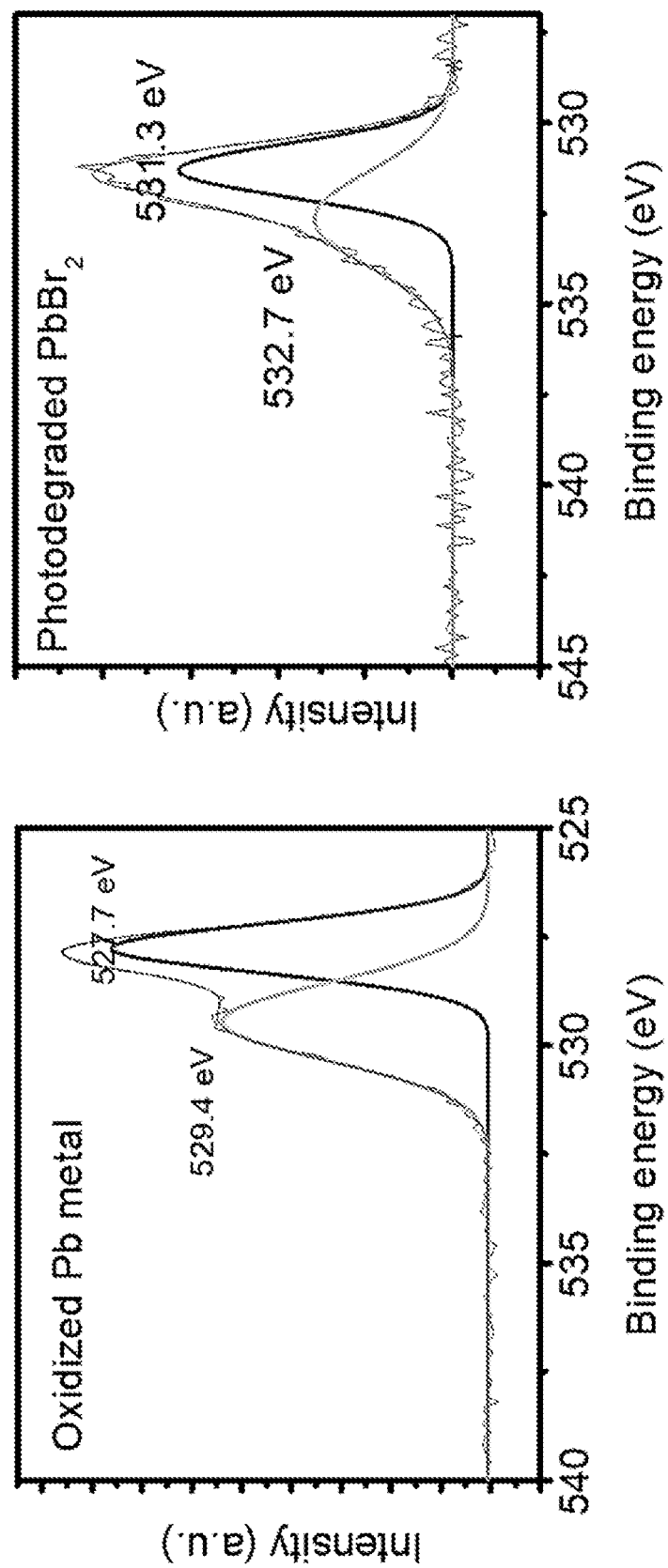
FIGS. 6A-6B show X-ray photoelectron spectra of (FIG. 6A) O1s electron from the surface layer of Pb metal which was oxidized in air.

Oxygen doping was confirmed to have a great enhancement effect on detection performance. Therefore, the range of effective dopant source compounds was extended from PbO to any substance which contains PbO or decomposes into PbO once heated. FIG. 6A shows the X-ray photoelectron spectra of O1s electron from oxidized Pb metal. The signal peak can be split into two peaks at 529.4 eV and 527.7 eV, respectively. The peak at 529.4 eV can be ascribed to the rhombic phase PbO, while the peak at 527.7 eV can be ascribed to $PbO_2$. Based on the results, the oxidized surface layer of Pb metal consisted of PbO and $PbO_2$. FIG. 6B shows the X-ray photoelectron spectra of O1s electron from darkened $PbBr_2$ powder. The signal peak can be split into two peaks at 532.7 eV and 531.3 eV, respectively. The peak at 532.7 eV can be ascribed to the Pb—O bond in $PbCO_3$, while the other peak can be ascribed to the O—H bond in $Pb(OH)_2$. Therefore, the surface layer of darkened $PbBr_2$ may include a mixture of $PbCO_3$, $Pb(OH)_2$, and $Pb_2(OH)_2CO_3$, all of which yield Pb oxides once heated. Therefore, in this invention, the effective dopant source compound was extended from PbO to $PbO_2$, $Pb_3O_4$, $PbCO_3$, $Pb(OH)_2$, and $Pb_2(OH)_2CO_3$, which can introduce PbO once heated.

Figure 7B:
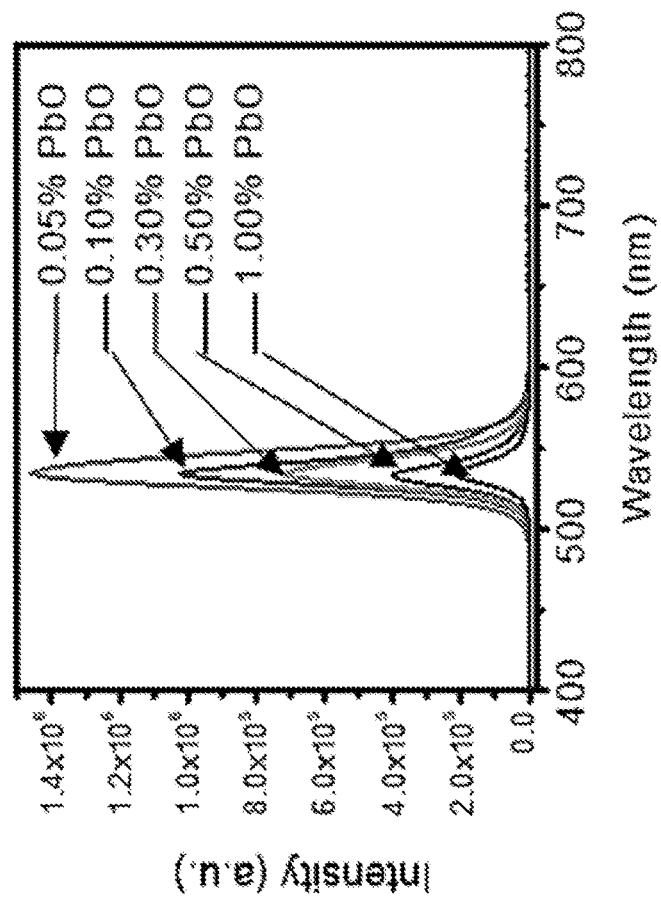
FIGS. 7A-7F show room temperature PL spectra of (FIG. 7A) an undoped $CsPbBr_3$ crystal.
Figure 7A:
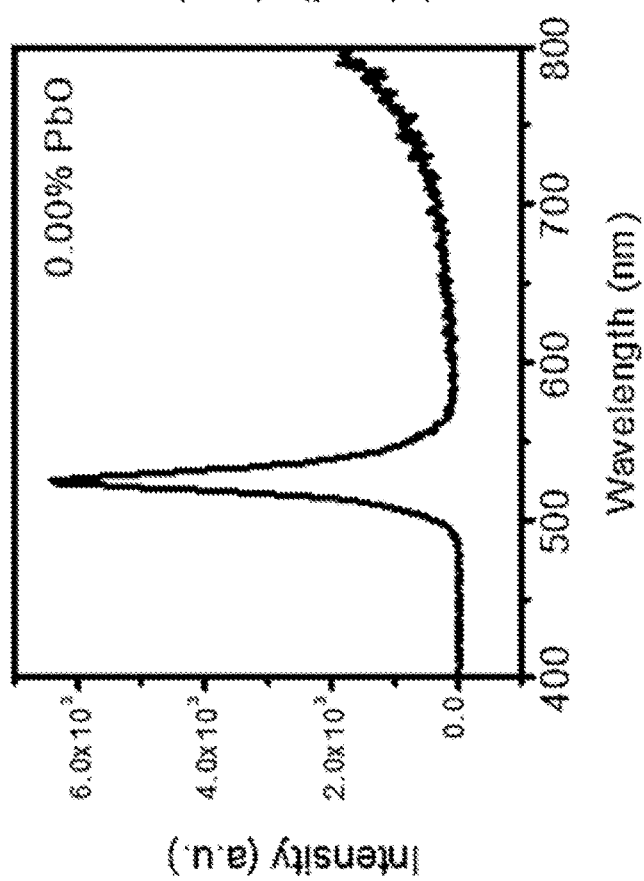
Figure 7D:
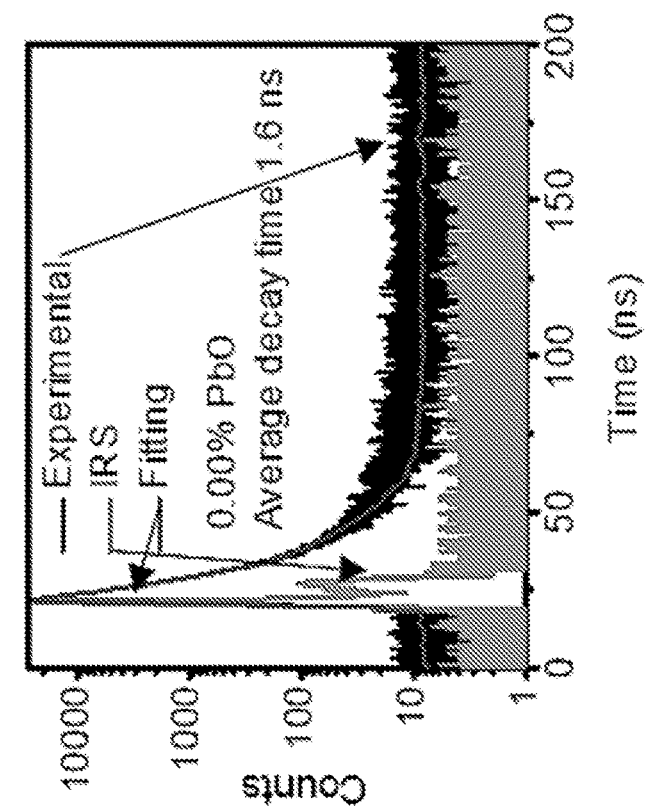
Figure 7C:
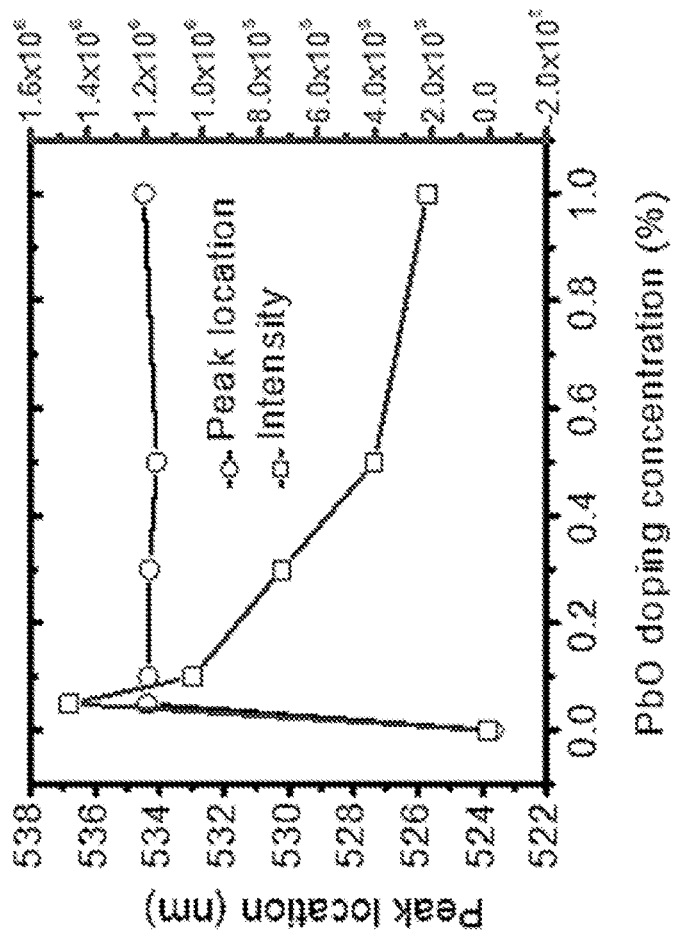

Improvement on photoluminescence properties. PL spectroscopy was carried out to gain insight into the lattice integrity of the as-grown crystals and determine whether any radiative defect is present. FIG. 7A shows the PL spectrum of an undoped sample at room temperature using a blue laser with a power of 0.5 mW and a wavelength of 405 nm. The undoped sample shows weak PL emission whose peak was at 524.0 nm, which can be ascribed to the intrinsic bandgap emission from $CsPbBr_3$. The weak emission could not be observed by the naked eye. The spectrum was accompanied by a broad defect-related emission beginning from 600 nm, revealing that certain defects act as radiative main trapping and recombination centers for photoinduced electron-hole pairs. FIG. 7B shows the PL spectra from oxygen doped samples under the identical experimental conditions. The general peak intensity for samples made using PbO as a dopant source compound at a concentration of 0.05% was enhanced to a maximum, which was 217 times higher than that from an undoped sample (Table 3). Most importantly, no broad defect-related emission was observed in all the spectra from oxygen doped samples, indicating absence of the radiative defect presenting in the undoped sample. The green PL emission was so intense that it could be observed by the naked eye. PL intensity gradually quenched with increasing concentrations of PbO as a dopant source compound, as shown in FIG. 7C. Remarkably, the PL intensity maintained the order of $10^5$ for the perovskites made using the highest concentration of 1.00% PbO as a dopant source, which is still one order of magnitude higher than that from the undoped sample. Compared to the peak location (524.0 nm) from the undoped sample, all the emission peaks from oxygen doped samples red shifted to 533.6 nm. The red shift and giant enhancement of the main emission peak for oxygen doped samples indicate that the emission may originate from the excitonic emission, which is supposed to have much higher carrier to photon conversion efficiency than that from the bandgap emission.

Figure 7F:
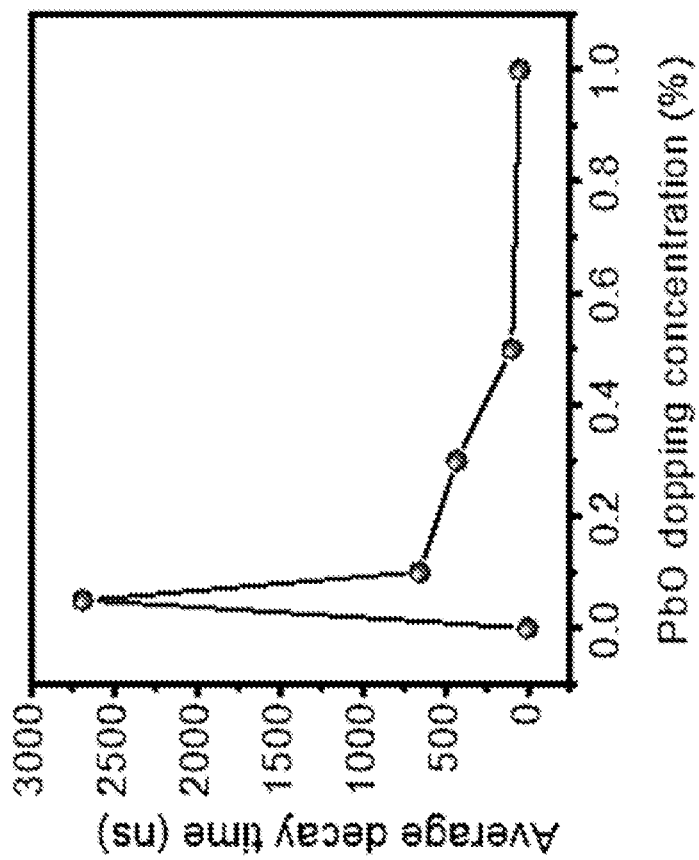
Figure 7E:
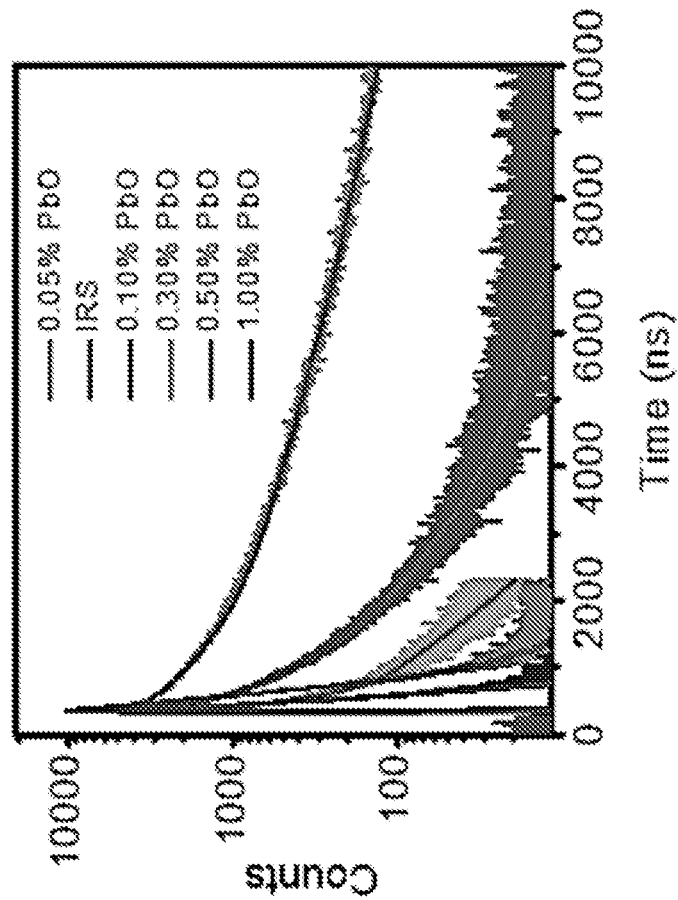
Figures 8A, 8B:
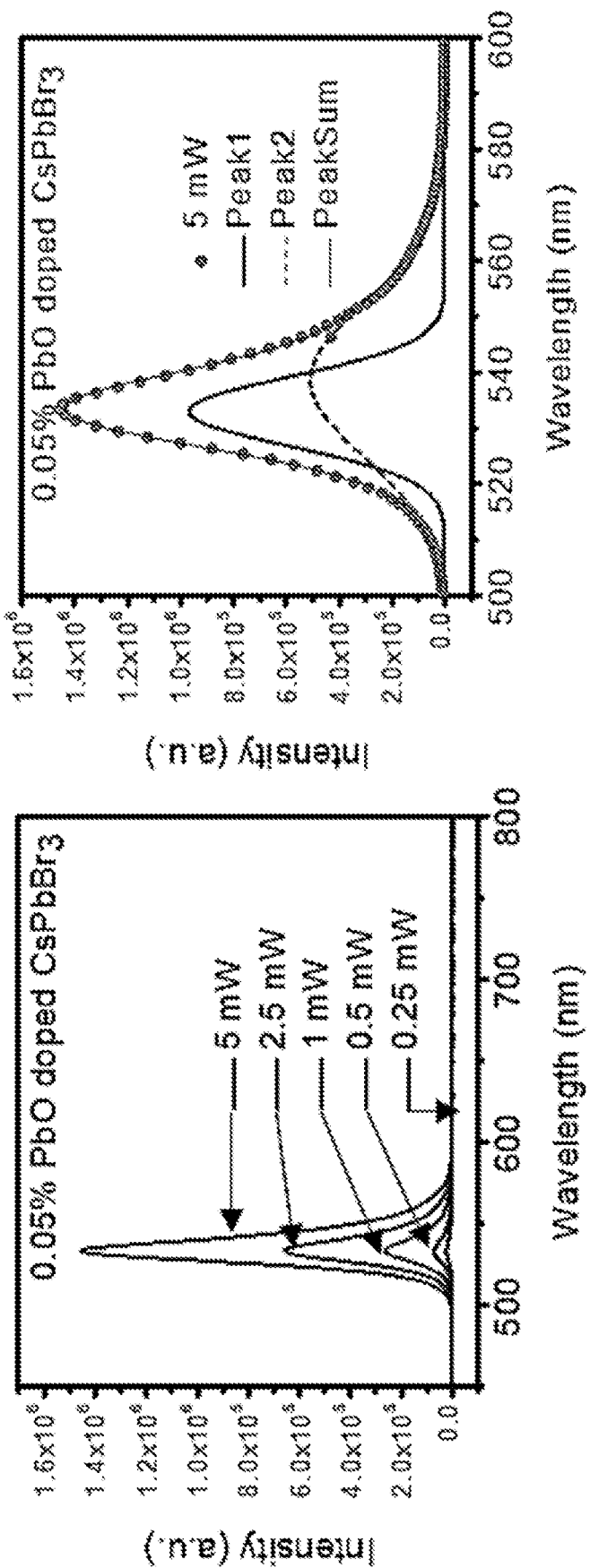
FIG. 8A shows laser power dependent room temperature PL spectra from the sample made using 0.05% PbO as a dopant source compound; room temperature PL spectrum collected from the sample made using 0.05% PbO as a dopant source compound under a laser power of (FIG. 8B) 5 mW.
Figure 8D:
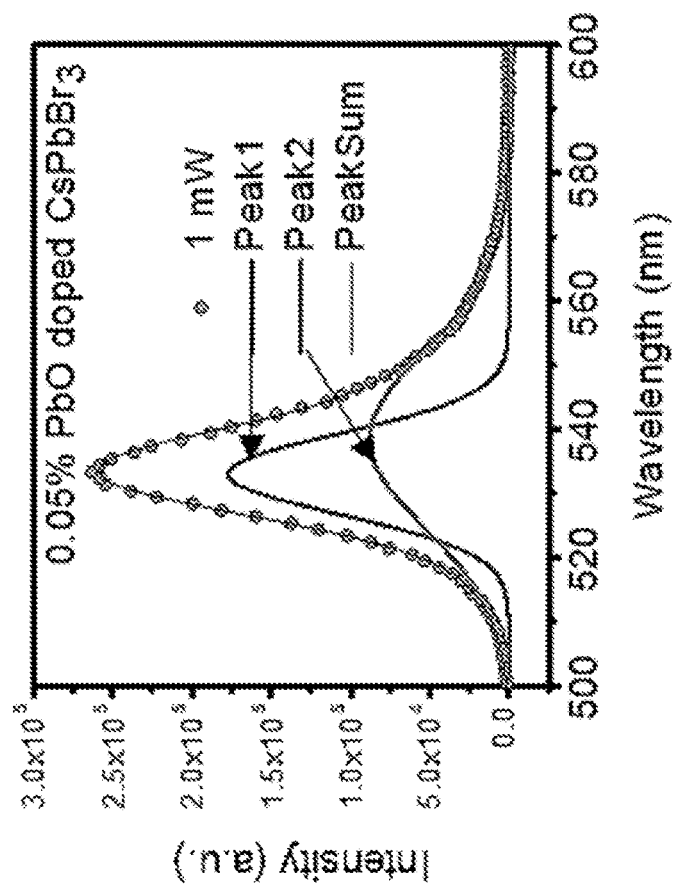
(FIG. 8D) 0.5 mW.
Figure 8C:
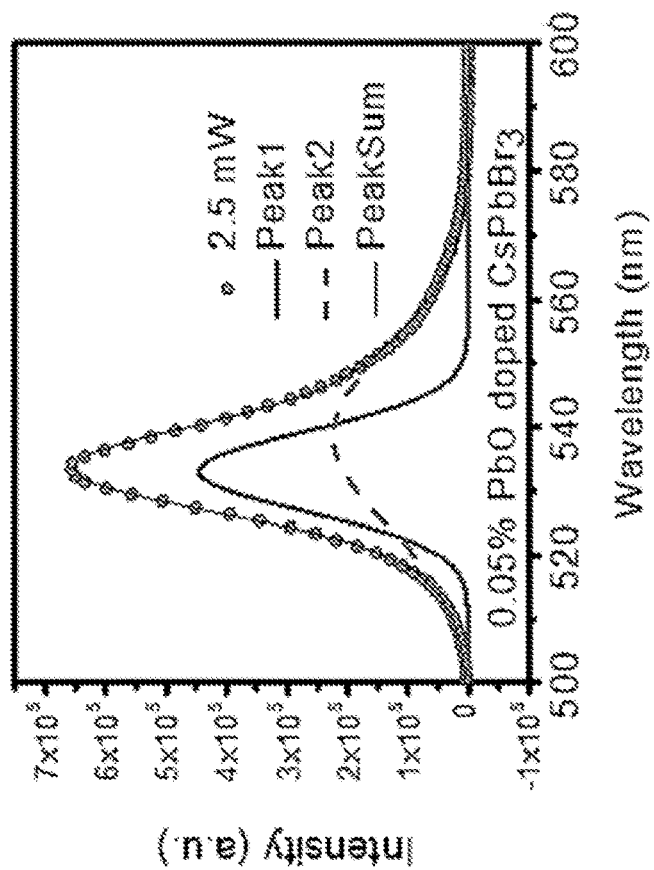
(FIG. 8C) 2.5 mW.
Figures 8E, 8F:
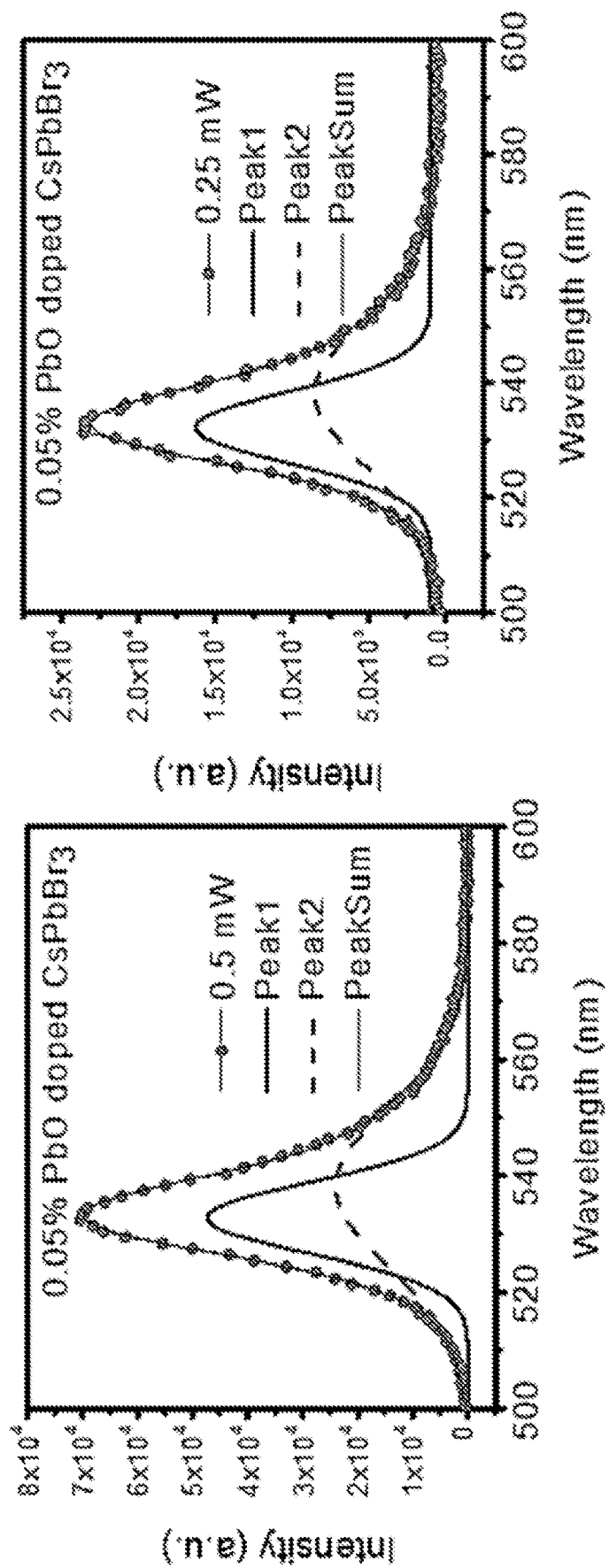
(FIG. 8E) 0.5 mW and (FIG. 8F) 0.25 mW. Two Gaussian peaks were used to fit (dotted line) all the spectra (black line).

PL decay time measurement is a powerful technique to reflect whether carrier lifetime is long or not, which in turn estimates a material's lattice integrity. FIG. 7D shows the time resolved PL decay spectrum for 524.0 nm emission for the undoped sample. The PL decayed dramatically, as the signal was barely above the signal from the instrument response. The average decay time was around 1.6 ns, as shown in Table 3. FIG. 7E shows the time resolved PL decay spectra for 533.6 nm emission for samples doped using various concentrations of PbO. Samples made using a PbO concentration of 0.05% gave the longest average decay time of 2689 ns (FIG. 7F), which agrees well with the highest carrier mobility-lifetime products for this PbO concentration. Average PL decay time decreased with increasing PbO concentration. The decay time dropped to the minimum of 49 ns for a PbO concentration of 1.00%. Higher concentrations of PbO may introduce more trapping and scattering centers, leading to a shorter carrier lifetime.

TABLE 3

General peak location, peak intensity, and average PL decay time for samples made using different concentrations of PbO as a dopant source compound at room temperature.

| PbO Concentration (%) | General peak location (nm) | General peak intensity | Ratio of peak intensity to that of undoped sample | Average PL decay time (ns) |
|---|---|---|---|---|
| 0.00 | 524.0 | $6.4 \times 10^3$ | 1:1 | 1.6 |
| 0.05 | 533.6 | $1.4 \times 10^6$ | 218:1 | 2689 |
| 0.10 | 533.6 | $1.0 \times 10^6$ | 156:1 | 656 |
| 0.30 | 533.6 | $7.2 \times 10^5$ | 112:1 | 432 |
| 0.50 | 533.6 | $4.0 \times 10^5$ | 62:1 | 96 |
| 1.00 | 534.3 | $2.2 \times 10^5$ | 34:1 | 49 |

To determine whether the radiative transition after oxygen doping was from excitonic emission, the excitation-intensity dependence of the PL emission was measured on emission for the perovskites using 0.05% PbO with laser powers in the range 0.25-5 mW (FIGS. 8A-8F). The intensity of each peak increased steadily with increasing laser power. All of the emission peaks can be split into two individual peaks (peak 1 and peak 2) by Gaussian fitting. The peak locations of peak 1 and 2 did not move with changing laser power. Table 4 shows the peak locations and intensity of peak 1 and peak 2 under different laser power.

Figure 9:
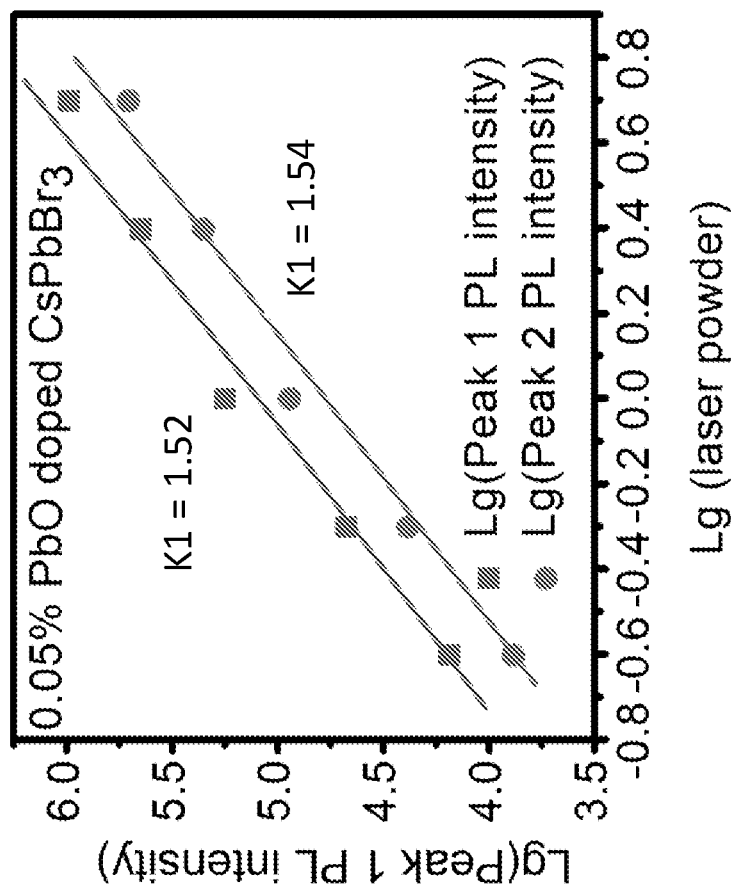
FIG. 9 shows log(PL intensity) vs. log(laser power) plots for the observed peaks.

The increase in PL intensity I with increasing excitation intensity L has a power law dependence $I \sim L^k$, governed by the exponent k. For excitation with a photon energy larger than the band-gap energy, the values of the slope, k, generally fall into one of the following ranges, $0<k<1$ or $1<k<2$. When $0<k<1$, the emission band was attributed to donor-acceptor pair recombination (DAP) or free-to-bound radiative recombination. When $1<k<2$, the emission was either due to free or bound exciton transitions. The k coefficient is the slope of log(PL intensity) vs. log(laser power) in the linear ranges, and for the two peaks k values of $1.52\pm0.08$ and $1.54\pm0.08$ for peaks 1 and 2, respectively, were found (FIG. 9). Peaks 1 and 2 fell well under the range of free or bound exciton transitions. Considering that peak 1 had higher peak energy, narrower FWHM, and higher intensity than those of peak 2, peak 1 and peak 2 can be ascribed to free-exciton emission and bound exciton emission.

In summary, oxygen doping not only resulted in the absence of radiative defect related to the broad defect emission in the undoped sample, but also changed transition type from bandgap emission to excitonic emission due to higher lattice integrity.

TABLE 4

Peak locations, FWHM and intensity of peak 1 and peak 2 under different laser powers.

| | Peak 1 | | | Peak 2 | | |
|---|---|---|---|---|---|---|
| Laser power (mW) | Peak location (nm) | FWHM (nm) | Intensity | Peak location (nm) | FWHM (nm) | Intensity |
| 5.0 | 533.0 | 12.4 | $9.6 \times 10^5$ | 538.5 | 27.3 | $5.1 \times 10^5$ |
| 2.5 | 533.0 | 12.4 | $4.4 \times 10^5$ | 538.5 | 27.4 | $2.2 \times 10^5$ |
| 1.0 | 533.0 | 12.2 | $1.7 \times 10^5$ | 538.4 | 27.4 | $8.7 \times 10^4$ |
| 0.5 | 533.0 | 12.4 | $4.7 \times 10^4$ | 538.2 | 27.3 | $2.4 \times 10^4$ |
| 0.25 | 533.0 | 12.5 | $1.5 \times 10^4$ | 538.5 | 27.0 | $7.6 \times 10^3$ |

Figure 10A:
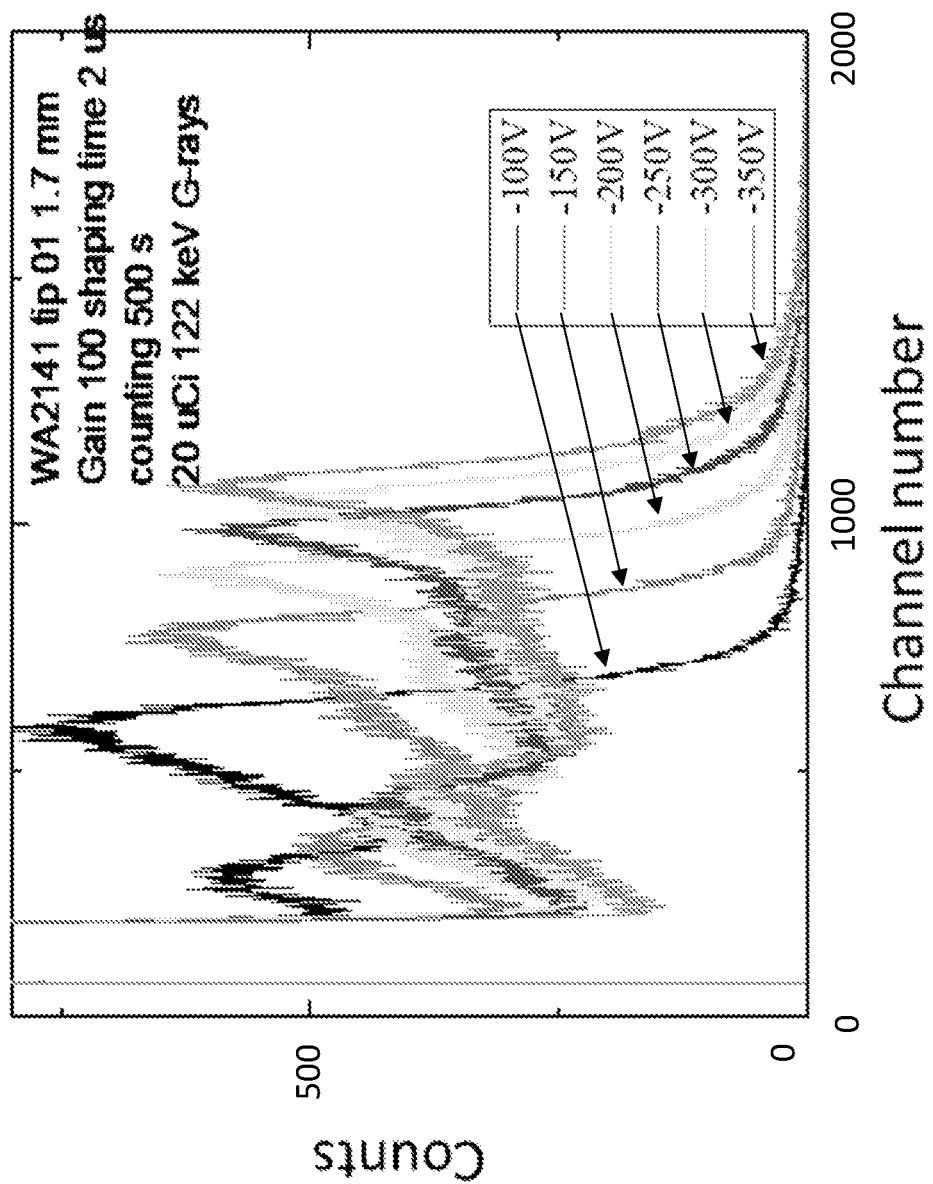
FIG. 10A is a graph of the 122 keV γ-ray pulse height spectra (electron collection) of planar devices made from oxygen-doped $CsPbBr_2Cl$ crystals.
Figure 10B:
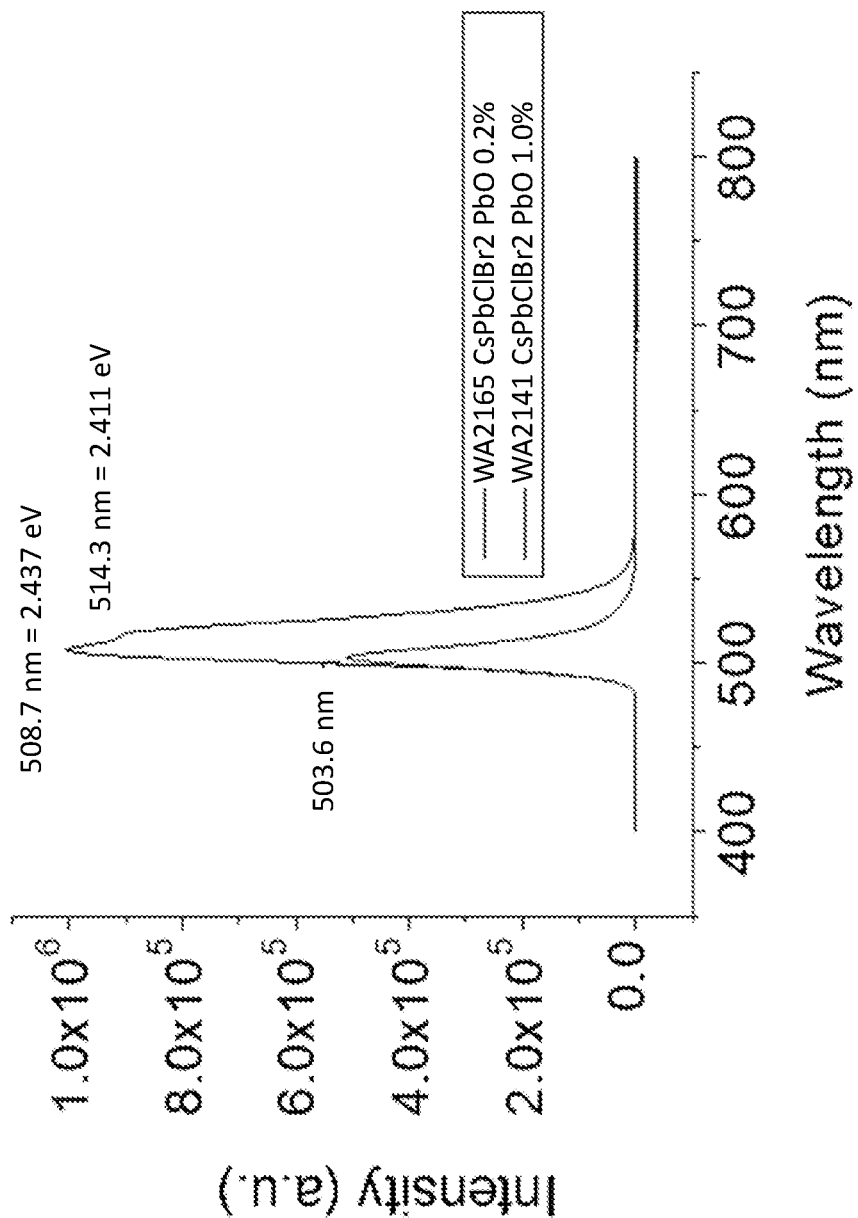
FIG. 10B is a graph of the room temperature PL spectra of the oxygen-doped $CsPbBr_2Cl$ crystals.
Figure 11A:
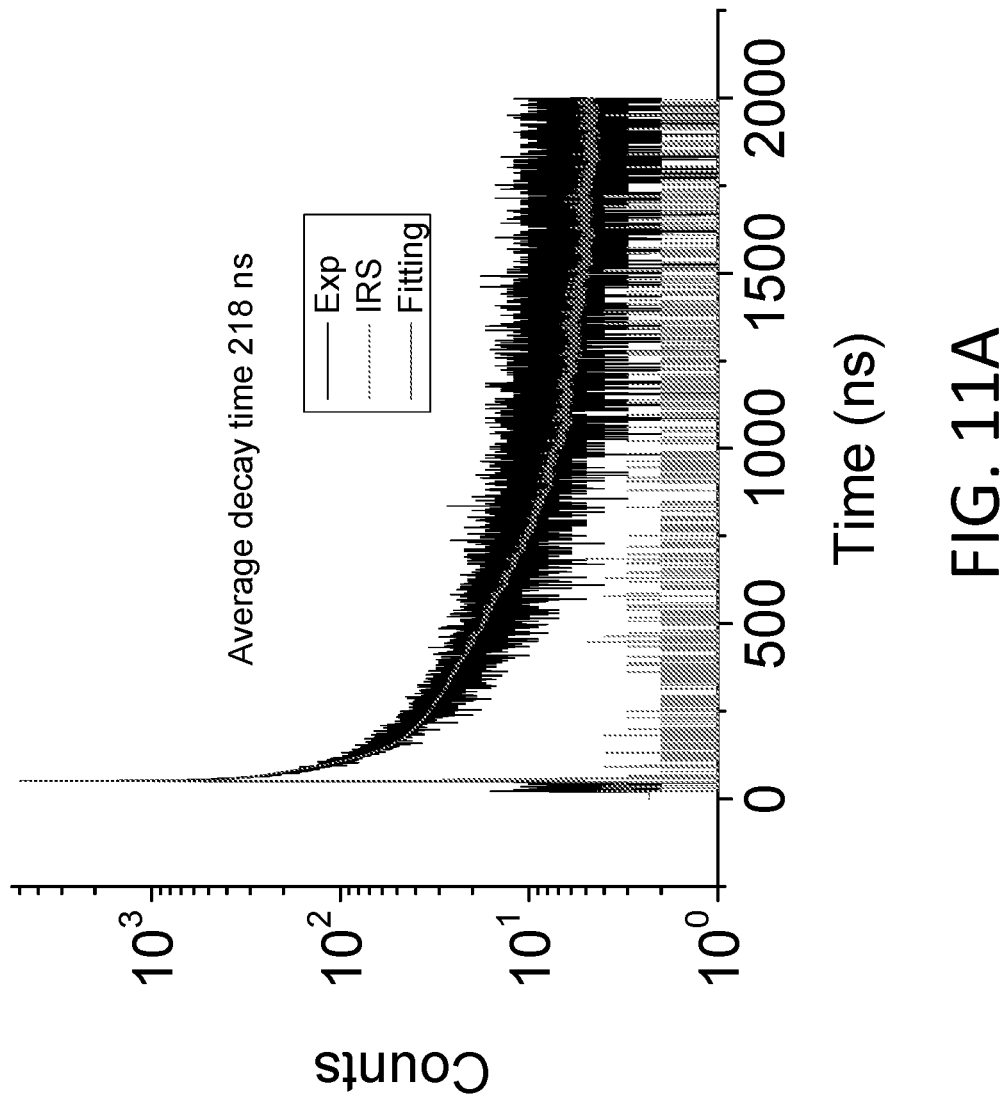
FIG. 11A shows the PL lifetime an oxygen-doped samples of $CsPbBr_2Cl$ (PbO 0.2%).
Figure 11B:
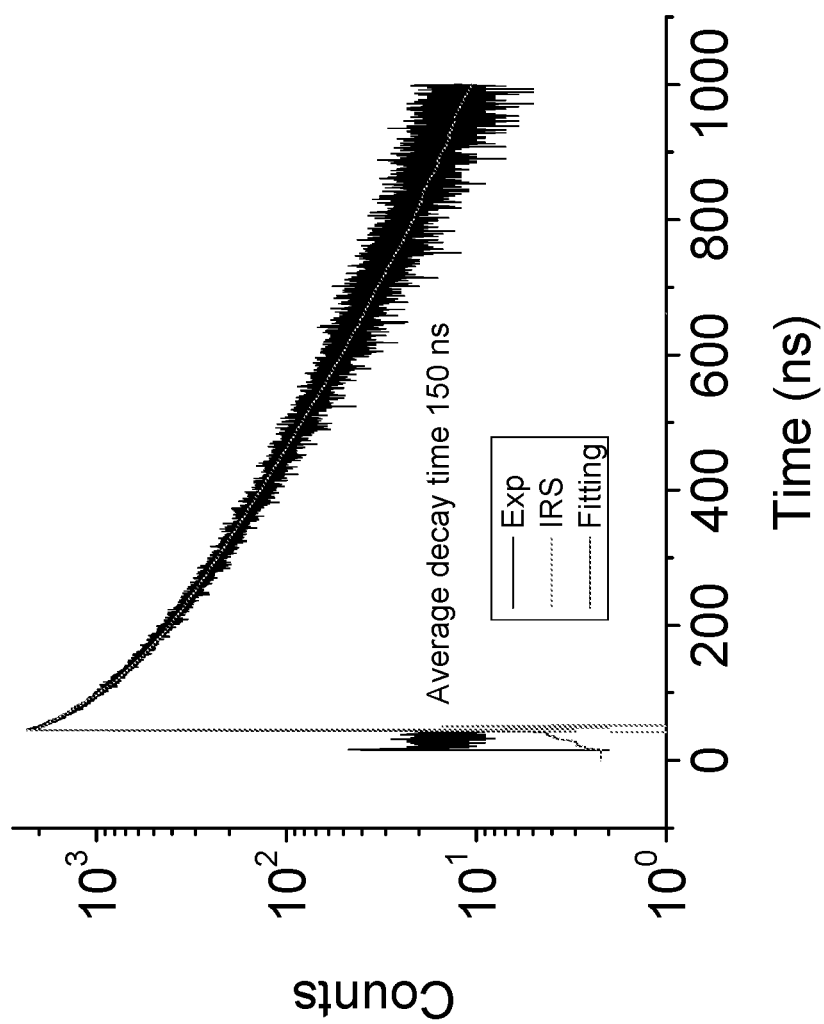
FIG. 11B shows the PL lifetime an oxygen-doped samples of $CsPbBr_2Cl$ (PbO 1%). The decay time goes up when the doping level goes down.
Figure 12:
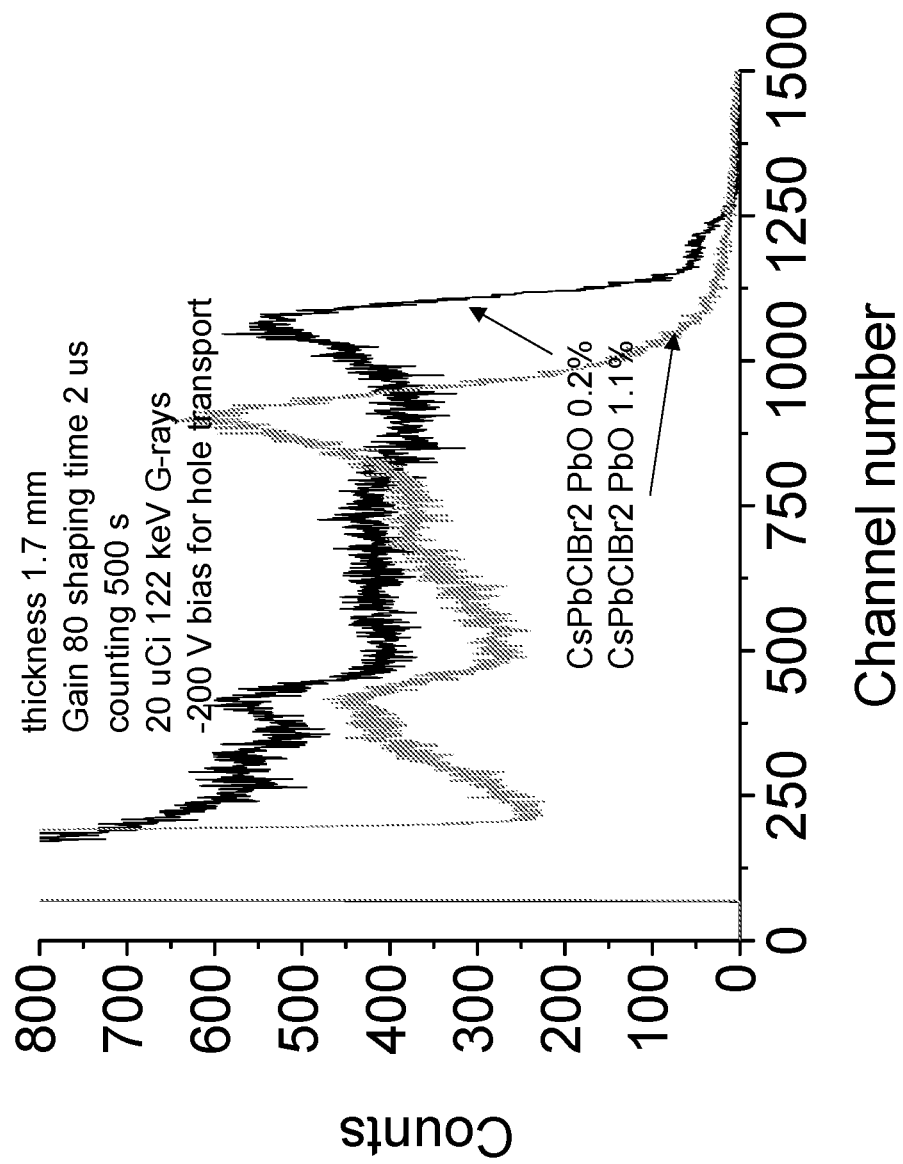
FIG. 12 shows the gamma-ray spectra obtained from two different oxygen doped samples of $CsPbBr_2Cl$, where the resolution of the spectra can be controlled by the amount of PbO dopant source added.
Figure 13:
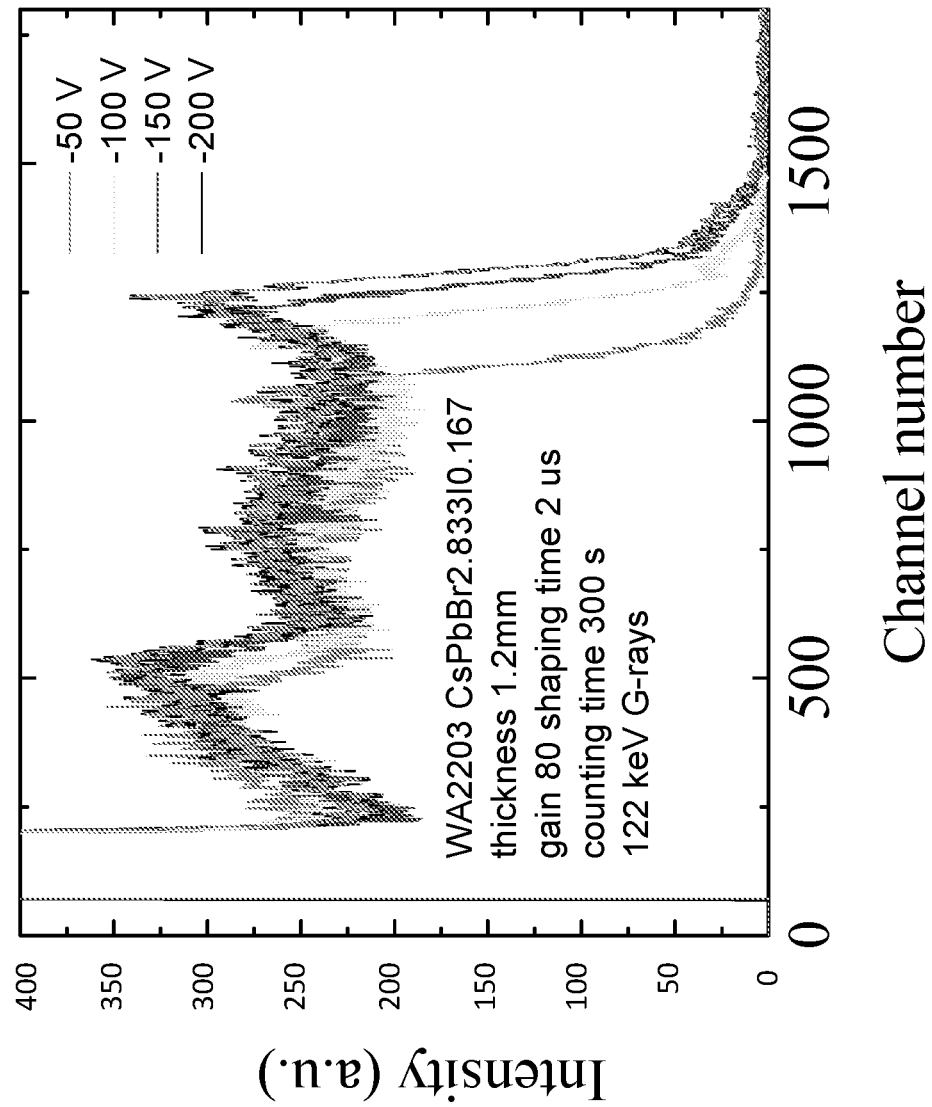
FIG. 13 shows the gamma-ray spectra obtained from a $CsPbBr_{2.83}I_{0.17}$ sample doped using a PbO oxygen dopant source. A radiation detector device made from the oxygen doped $CsPbBr_{2.83}I_{0.17}$ with a resolving the energy of 57-Co source was able to detect 122 keV g-rays. A PbO concentration of 0.5% was used to dope the sample.

Additional examples are illustrated in FIGS. 10, 11, 12. For these examples, oxygen doped $CsPbBr_{3-x}Cl_x$ was made using PbO as a dopant source and the properties of the doped perovskites were measured according to the procedures described above. The oxygen-doped mixed halide crystals of the type $CsPbBr_{3-x}Cl_x$ exhibited good energy resolution for gamma-rays (FIGS. 10A and 10B). The $CsPbBr_2Cl$ crystals doped using different amounts of PbO showed stronger PL than their undoped counterparts, and the mixed perovskite doped using 0.2% PbO as the oxygen dopant source had stronger PL than the mixed perovskite dope using 1% PbO (FIG. 10). FIGS. 11A and 11B shows the PL lifetimes of two different oxygen-doped samples of $CsPbBr_2Cl$ where the lifetime can be controlled by the amount of PbO dopant source added. FIG. 12 shows the gamma-ray spectra obtained from two different oxygen doped samples of $CsPbBr_2Cl$ where the resolution of the spectra can be controlled by the amount of PbO dopant source added. Another implementation is illustrated in FIG. 13 for a $CsPbBr_{3-x}I_x$ sample doped using a PbO oxygen dopant source. FIG. 13 shows a radiation detector device made from oxygen doped $CsPbBr_{2.83}I_{0.17}$ resolving the energy of 57-Co source 122 keV g-rays. A PbO concentration of 0.5% was used to dope the sample.

Figure 14A:
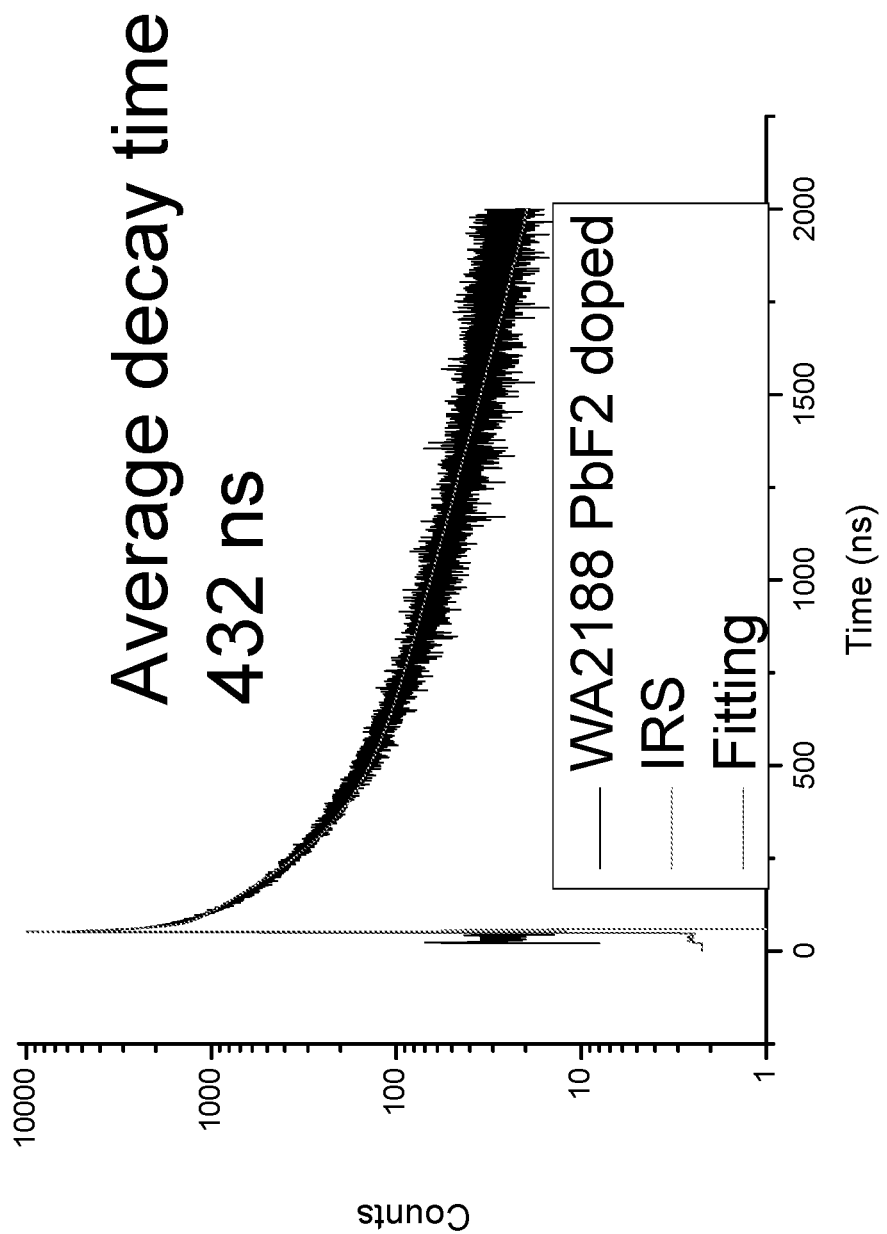
FIGS. 14A and 14B show the PL lifetimes of a fluorine doped $CsPbBr_3$ sample (0.5% $PbF_2$) (FIG. 14A) and an undoped $CsPbBr_3$ material (FIG. 14B). Great enhancement in the PL decay time resulted from the fluorine dopants. This may be attributed to a reduction in the concentration of halide (e.g., Br) vacancies.
Figure 14B:
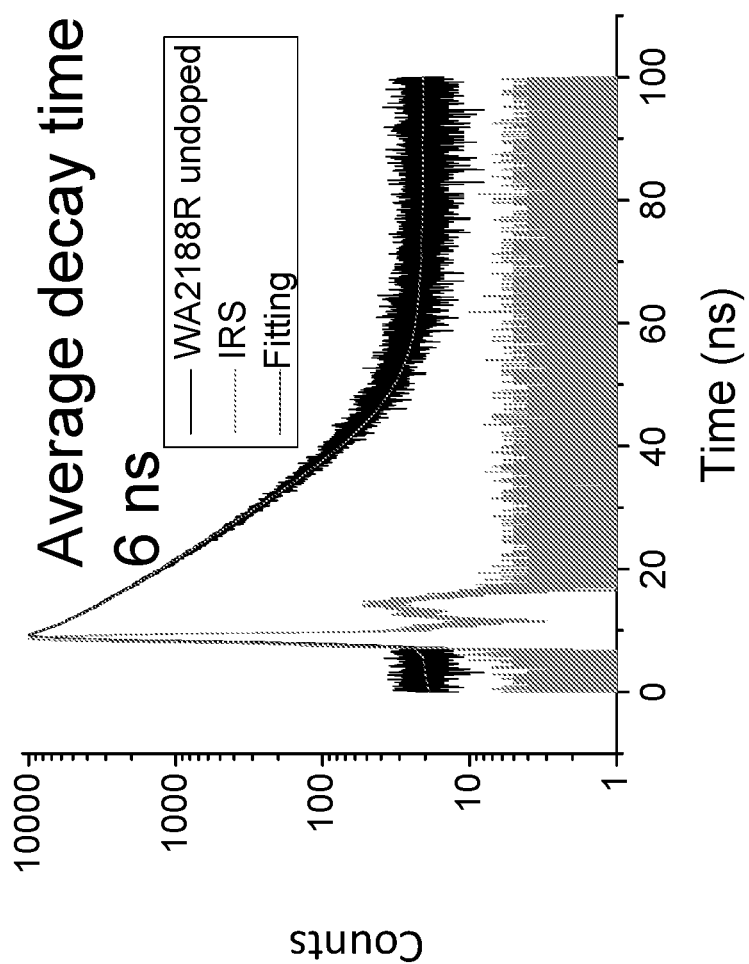

Fluorine atom doped $CsPbBr_3$ and $CsPbBr_{3-x}Cl_x$ were also made and characterized using the methods described herein, but replacing PbO with $PbF_2$ as a dopant source. Fluorine can be a beneficial dopant in $CsPbBr_{3-x}Cl_x$ and $CsPbBr_{3-x}I_x$ materials. FIG. 14A shows the PL lifetime of a fluorine doped $CsPbBr_3$ sample where the PL lifetimes can be considerably increased compared to undoped $CsPbBr_3$ material (FIG. 14B).

Synthesis, purification, and crystal growth. Polycrystalline $CsPbBr_3$ raw material doped fluorine, using $PbF_2$ as a dopant source, was synthesized by the direct chemical reaction of CsBr and $PbBr_2$ precursors with the stoichiometric molar ratio of 1:1 in a fused silica tube with an inner diameter of 22 mm, which was flame sealed under vacuum. The total amount of combined CsBr and $PbBr_2$ was 85 g. The synthesis was performed at 650° C. for 48 h in a temperature-programmed rocking furnace to ensure complete reaction, followed by slow cooling at a rate of 20° $C. \cdot cm^{-1}$ to room temperature. The resultant ternary product was not subject to any purification process. After synthesis, various concentrations of $PbF_2$ were added from 0.01 to 1% molar as a dopant source compound. The $CsPbBr_3$ and $PbF_2$ were loaded into conical-tip quartz ampoules with a thickness of 1.5 mm and an inner diameter of 10 mm, respectively. Subsequently, these ampoules were sealed at a vacuum level of $3 \times 10^{-4}$ mbar. The crystal growth was performed in a vertical 3-zone Bridgman furnace. (Bridgman, P. W. et al., *Proceedings of the American Academy of Arts and Sciences* 1925, 60 (6), 305-383.) Prior to actual crystal growth, the tube was held still in the hot zone of the Bridgman furnace for 12 h to ensure complete melting. Subsequently, the ampoule was translated downward from the upper zone (580° C.), to the middle zone (500° C.), to the cold zone (380° C.) at a slow translation speed of 0.5 $mm \cdot h^{-1}$ and a temperature gradient of around 5.1° $C. \cdot cm^{-1}$. After complete crystallization of the whole $CsPbBr_3$ flux, the ampoule was cooled down to room temperature at an increased dropping speed of 5.0 mm/h, which generated a cooling down rate of 5° C./h. All of the 6 boules made using various concentrations of a dopant source compound were grown one by one under the same furnace with identical temperature settings and translation speed.

The presence of oxygen and fluorine dopants in the perovskite crystals described herein can be detected by XPS analysis, Secondary Ion Mass Spectroscopy (SIMS) analysis, and Instrumental Gas Analysis (IGA) which can measure 0 and F present in solid materials from ppm to percentage levels.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can mean "one or more" and can also mean only one; both embodiments are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A doped perovskite comprising:
    a perovskite single-crystal having a chemical formula $CsAX_3$, a chemical formula $RbAX_3$, or a chemical formula $Cs_{1-x}Rb_xPbX_3$, where $0<x<1$, wherein A represents Pb or a combination of Pb and one or more of Sn, Si, and Ge, and X represents one or more halogen atoms; and
    oxygen atom dopants or fluorine atom dopants in a crystal lattice of the perovskite single-crystal.

2. The doped perovskite of claim 1, comprising the oxygen atom dopants.

3. The doped perovskite of claim 2, wherein the perovskite single-crystal has a chemical formula $CsPbBr_3$, and the crystal lattice of the perovskite single-crystal is doped with the oxygen atom dopants.

4. The doped perovskite of claim 3, wherein the oxygen-doped $CsPbBr_3$ has a concentration of the oxygen atom dopants in a range from 1 ppm to 10000 ppm.

5. The doped perovskite of claim 1, wherein the doped perovskite has a concentration of the oxygen atom dopants or a concentration of the fluorine atom dopants in a range from 1 ppm to 10000 ppm.

6. The doped perovskite of claim 1, comprising the fluorine atom dopants.

7. A device for a detection of incident radiation comprising:
    a photoactive layer comprising:
        a perovskite single-crystal having a chemical formula $CsAX_3$, a chemical formula $RbAX_3$, or a chemical formula $Cs_{1-x}RbxPbX_3$, where $0<x<1$, wherein A represents Pb or a combination of Pb and one or more of Sn, Si, and Ge, and X represents one or more halogen atoms; and
        oxygen atom dopants or fluorine atom dopants in a crystal lattice of the perovskite single-crystal;
    a first electrode in electrical communication with the photoactive layer;
    a second electrode in electrical communication with the photoactive layer,
    wherein the first electrode and the second electrode are configured to apply an electric field across the photoactive layer; and
    a signal detector configured to measure a photocurrent generated in the photoactive layer when the photoactive layer is exposed to incident X-rays, gamma-rays, and/or alpha-particles.

8. The device of claim 7, wherein the crystal lattice of the perovskite single-crystal is doped with the oxygen atom dopants.

9. The device of claim 8, wherein the perovskite single-crystal has the chemical formula $CsPbBr_3$.

10. The device of claim 7, wherein a concentration of the oxygen atom dopants or a concentration of the fluorine atom dopants in the crystal lattice of the perovskite single-crystal is in a range from 1 ppm to 10000 ppm.

11. The device of claim 7, wherein the photoactive layer comprises only a single perovskite phase.

12. The device of claim 7, wherein the crystal lattice of the perovskite single-crystal is doped with the fluorine atom dopants.

13. A method for detecting incident radiation using a device comprising:
    a photoactive layer comprising:
        a perovskite single-crystal having a chemical formula $CsAX_3$, a chemical formula $RbAX_3$, or a chemical formula $Cs_{1-x}Rb_xPbX_3$, where $0<x<1$, wherein A represents Pb or a combination of Pb and one or more of Sn, Si, and Ge, and X represents one or more halogen atoms; and
        oxygen atom dopants or fluorine atom dopants in a crystal lattice of the perovskite single-crystal;
    a first electrode in electrical communication with the photoactive layer;
    a second electrode in electrical communication with the photoactive layer, wherein
    the first electrode and the second electrode are configured to apply an electric field across the photoactive layer; and
    a signal detector configured to measure a photocurrent generated in the photoactive layer when the photoactive layer is exposed to incident X-rays, gamma-rays, and/or alpha-particles, the method comprising:
    exposing the photoactive layer of the device to incident radiation comprising X-rays, gamma rays, and/or alpha particles, whereby the photoactive layer absorbs the incident radiation and a photocurrent is generated in the photoactive layer; and
    measuring at least one of an energy and an intensity of the absorbed incident radiation by detecting the photocurrent.

14. A method of making an oxygen-doped perovskite or a fluorine-doped perovskite having a chemical formula $CsAX_3$, a chemical formula $RbAX_3$, or a chemical formula $Cs_{1-x}Rb_xPbX_3$, where $0<x<1$, where A represents Pb or a combination of Pb and one or more of Sn, Si, and Ge, X represents one or more halogen atoms, the method comprising:
    forming a mixture of a perovskite having the chemical formula $CsAX_3$, the chemical formula $RbAX_3$, or the chemical formula $Cs_{1-x}Rb_xPbX_3$, where $0<x<1$, where A represents Pb, Sn, Si, Ge, or a combination of two or more thereof, and X represents one or more halogen atoms, and a dopant source compound comprising:

PbO;
a lead and oxygen-containing compound that decomposes into PbO when the lead and oxygen-containing compound is heated;
$PbF_2$; or
a lead and fluorine-containing compound that decomposes into $PbF_2$ when the lead and fluorine-containing compound is heated;
melting the perovskite and the dopant source compound to form a melt; and
crystalizing the oxygen-doped perovskite or the fluorine-doped perovskite from the melt.

15. The method of claim 14, wherein the oxygen-doped perovskite or the fluorine-doped perovskite has a concentration of oxygen atom dopants or a concentration of fluoride atom dopants in a range from 1 ppm to 10000 ppm.

16. The method of claim 15, wherein the perovskite is an oxygen-doped perovskite and the dopant source compound comprises PbO.

17. The method of claim 14, wherein a concentration of the dopant source compound in the mixture of the perovskite and the dopant source compound is in a range from 0.01 mol. % to 1 mol. %.

18. The method of claim 14, wherein the perovskite is $CsPbBr_3$.

19. The method of claim 14, wherein the perovskite is the oxygen-doped perovskite, and the dopant source compound comprises $PbO_2$, $Pb_3O_4$, $Pb(OH)_2$, $PbCO_3$, $Pb_2(OH)_2CO_3$, or a combination of two or more thereof.

20. The method of claim 14, wherein the perovskite is the fluorine-doped perovskite and the dopant source compound comprises $PbF_2$.

* * * * *